United States Patent
Kwak et al.

(10) Patent No.: US 11,088,344 B2
(45) Date of Patent: Aug. 10, 2021

(54) DISPLAY INCLUDING FILLER MEMBER HAVING SEPARATION SPACE ALLOWING LIGHT TO BE TRANSMITTED TO OPTICAL ADHESIVE MEMBER AND ELECTRONIC DEVICE INCLUDING THE SAME

(71) Applicant: Samsung Electronics Co., Ltd., Gyeonggi-do (KR)

(72) Inventors: Kiju Kwak, Gyeonggi-do (KR); Sunggwan Woo, Gyeonggi-do (KR); Hunjo Jung, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/423,758

(22) Filed: May 28, 2019

(65) Prior Publication Data

US 2019/0363277 A1    Nov. 28, 2019

(30) Foreign Application Priority Data

May 25, 2018  (KR) .......................... 10-2018-0059892

(51) Int. Cl.
   H01L 51/52           (2006.01)

(52) U.S. Cl.
   CPC ........ H01L 51/524 (2013.01); H01L 51/5203 (2013.01); H01L 51/5253 (2013.01)

(58) Field of Classification Search
   CPC ... H01L 33/486; H01L 33/502; H01L 33/505; H01L 33/507; H01L 33/54; H01L 33/56; H01L 2933/0041; H01L 2933/005
   See application file for complete search history.

(56) References Cited

U.S. PATENT DOCUMENTS

| | | |
|---|---|---|
| 2010/0003425 A1 | 1/2010 | Kamata et al. |
| 2015/0185527 A1 | 7/2015 | Chang |
| 2017/0075161 A1 | 3/2017 | Kato et al. |
| 2017/0094821 A1* | 3/2017 | Allore ............... B29C 45/14311 |
| 2017/0121564 A1* | 5/2017 | Cho ............................ C09J 4/06 |
| 2018/0138257 A1* | 5/2018 | Higano ............... H01L 27/3244 |
| 2018/0166507 A1* | 6/2018 | Hwang ................. G06F 3/0416 |

FOREIGN PATENT DOCUMENTS

| | | |
|---|---|---|
| JP | 2015-232656 | 12/2015 |
| KR | 1020160070241 | 6/2016 |
| KR | 10-2019-0035354 | 4/2019 |
| WO | WO 2019/066404 | 4/2019 |

OTHER PUBLICATIONS

International Search Report dated Sep. 11, 2019 issued in counterpart application No. PCT/KR2019/006309, 11 pages.

* cited by examiner

*Primary Examiner* — Zandra V Smith
*Assistant Examiner* — Andre C Stevenson
(74) *Attorney, Agent, or Firm* — The Farrell Law Firm, P.C.

(57) ABSTRACT

An electronic device is provided, which includes a window including a transparent area and an opaque area; a panel disposed below the transparent area and including multiple pixels; a substrate disposed below the panel; an optical adhesive member disposed between the window and the panel; and a filler member disposed in at least a portion of a space formed between the opaque area and the substrate. The filler member transmits a light of a designated band, which is for curing the optical adhesive member, to a portion of the optical adhesive member disposed below the opaque area through a separation space between the filler member and the portion of the optical adhesive member.

20 Claims, 27 Drawing Sheets ial adhesive member disposed below the opaque area through a separation space between the filler member and the portion of the optical adhesive member.

In accordance with another aspect of the disclosure, an electronic device is provided, which includes a window including a transparent area and an opaque area; a panel disposed below the transparent area and including multiple pixels; a substrate disposed below the panel; an optical adhesive member disposed between the window and the panel; and a filler member disposed in at least a portion of a space formed between the opaque area and the substrate. The filler member is light-transmissive and disposed apart from the optical adhesive member, and the filler member transmits an external light of a designated band, which is for curing the optical adhesive member, to a portion of the optical adhesive member disposed below the opaque area through a separation space between the filler member and the portion of the optical adhesive member.

DISPLAY INCLUDING FILLER MEMBER HAVING SEPARATION SPACE ALLOWING LIGHT TO BE TRANSMITTED TO OPTICAL ADHESIVE MEMBER AND ELECTRONIC DEVICE INCLUDING THE SAME

CROSS-REFERENCE TO RELATED APPLICATION(S)

This application is based on and claims priority under 35 U.S.C. 119 to Korean Patent Application No. 10-2018-0059892, filed on May 25, 2018, in the Korean Intellectual Property Office, the disclosure of which is herein incorporated by reference in its entirety.

BACKGROUND

1. Field

The disclosure relates generally to a display including a filler member having a separation space that allows light to be transmitted to an optical adhesive member, and an electronic device including the display.

2. Description of Related Art

As computers and the Internet have evolved, electronic devices are being provided as information devices that combine artificial intelligence and network technology. A ubiquitous society, in which information devices are becoming diverse and evolving so that the information devices are capable of using resources or accessing networks anytime and anywhere, is becoming more of a reality.

Electronic devices are essentially equipped with displays that display information, and the display industry is becoming an important part of the ubiquitous society.

A conventional display may include a light-emitting portion including multiple pixels and an extension connected to the light-emitting portion. Additionally, an electronic device may include an outer plate that defines an outer face of the electronic device, and the light-emitting portion of the display may be coupled to the outer plate. However, the extension of the display is separated from the outer plate, and as a result, the possibility of breakage due to an external force such as an impact may be relatively high compared to the light-emitting portion.

SUMMARY

The disclosure has been made to address at least the disadvantages described above and to provide at least the advantages described below.

Accordingly, an aspect of the disclosure is to provide a display including a filler member having a separation space through which light can be transmitted to an optical adhesive member in order to increase the mechanical strength of the display, and an electronic apparatus including the display.

In accordance with an aspect of the disclosure, an electronic device is provided, which includes a window including a transparent area and an opaque area; a panel disposed below the transparent area and including multiple pixels; a substrate disposed below the panel; an optical adhesive member disposed between the window and the panel; and a filler member disposed at least a portion of a space formed between the opaque area and the substrate. The filler member may transmit a light of a designated band, which is for curing the optical adhesive member, to a portion of the opt-

BRIEF DESCRIPTION OF THE DRAWINGS

The above and other aspects, features, and advantages of certain embodiments of the disclosure will be more apparent from the following description taken in conjunction with the accompanying drawings, in which:

FIG. 4B illustrates a cross-sectional view of the display taken along line A-A in

FIG. 4A;

DETAILED DESCRIPTION

Figure 1A:
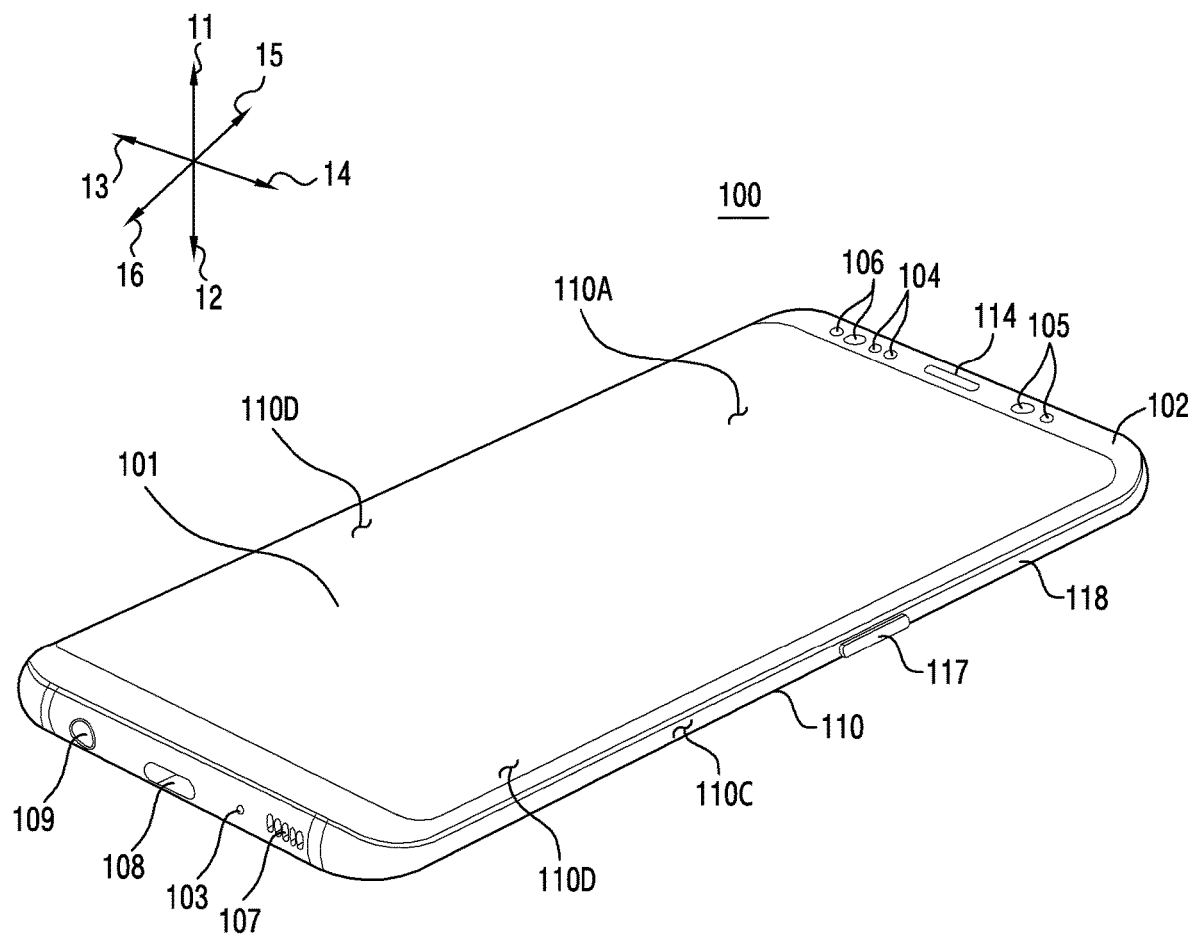
FIG. 1A illustrates a front perspective view of a mobile electronic device including a display coupled with a window according to an embodiment.

Hereinafter, various embodiments of the disclosure will be described with reference to the accompanying drawings. The various embodiments disclosed herein and terms for describing the embodiments are not intended to limit the technical features disclosed herein to specific embodiments. Instead, the embodiments include various modifications, equivalents, and/or substitutions of the corresponding embodiments.

In describing the drawings, similar reference numerals may be used to designate similar constituent elements.

The singular form of a noun corresponding to an item may include one or more of items, unless the context clearly indicates otherwise.

Herein, each of phrases, such as "A or B", "at least one of A and B", "at least one of A or B", "A, B, or C", "at least one of A, B, and C", and "at least one of A, B, or C" may include all possible combinations of items listed together in the corresponding phrase among the phrases.

Terms such as "first" and "second" may be used to distinguish corresponding components from other components, and the components are not limited in other respects (e.g., importance or order).

When a certain (e.g., first) component is mentioned as being "coupled" or "connected" to another (e.g., second) component, with or without a term such as "functionally" or "communicatively", the certain component can be connected to the other component directly (e.g., wiredly), wirelessly, or via a third component.

An electronic device according to an embodiment may include a portable communication device (e.g., smartphone), a computer device, a portable multimedia device, a portable medical device, a camera, a wearable device, or a home appliance. However, an electronic device according to an embodiment is not limited to the above described devices.

Herein, the term "user" may indicate a person using an electronic device or a device (e.g., an artificial intelligence electronic device) using an electronic device.

Figure 1B:
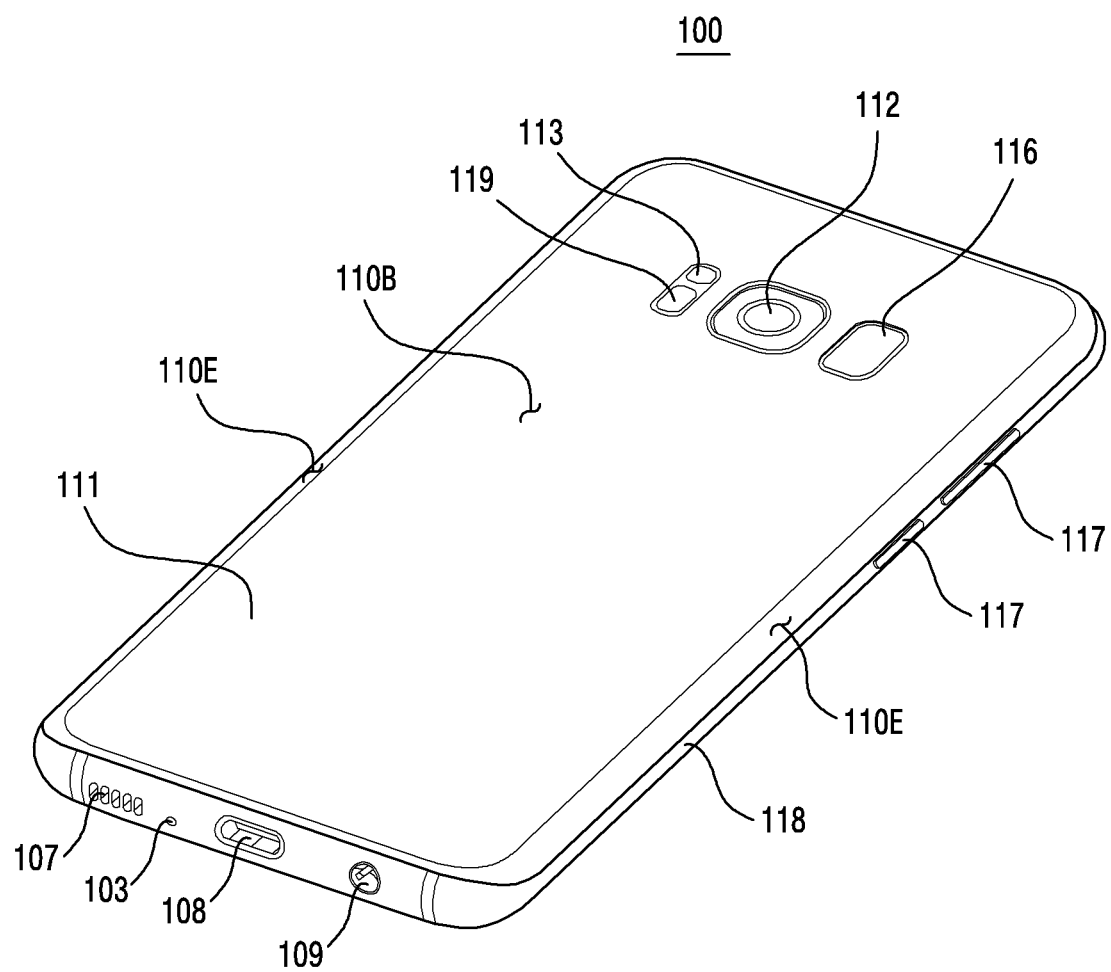
FIG. 1B illustrates a rear perspective view of the electronic device of FIG. 1A.

FIG. 1A illustrates a front side perspective view of a mobile electronic device according to an embodiment. FIG. 1B illustrates a rear perspective view of the electronic device of FIG. 1A.

Referring to FIGS. 1A and 1B, an electronic device 100 includes a housing 110 including a front face 110A, a rear face 110B, and side faces 110C surrounding a space between the front face 110A and the rear face 110B. Herein, the term "housing" may refer to a structure forming some of the front face 110A, the rear face 110B, and the side faces 110C of FIG. 1.

At least a part of the front face 110A may be formed of a substantially transparent front plate (or a window) 102 (e.g., a glass plate or a polymer plate including various coating layers). The rear face 110B may be formed of a substantially opaque rear plate 111. The rear plate 111 may be formed of coated or colored glass, ceramic, a polymer, or a metal (e.g., aluminum, stainless steel (STS), or magnesium), or a combination of two or more of these materials.

The side faces 110C may be formed by a side bezel structure (or a "side member") 118 coupled to the front plate 102 and the rear plate 111 and including a metal and/or a polymer. The rear plate 111 and the side bezel structure 118 may be integrally formed, and may include the same material (e.g., a metal material such as aluminum).

The front plate 102 may include two first peripheral areas 110D, which are bent from the front face 110A toward the rear plate 111 and extend seamlessly, at the long opposite side edges thereof.

As illustrated in FIG. 1B, the rear plate 111 includes two second peripheral areas 110E, which are bent from the rear face 110B toward the front plate 102 and extend seamlessly, at the long opposite side edges thereof. Alternatively, the front plate 102 (or the rear plate 111) may include only one of the first peripheral areas 110D (or the second peripheral areas 110E). Additionally, some of the first peripheral areas 110D and the second peripheral areas 110E may be omitted.

When viewed from a side of the electronic device, the side bezel structure 118 may have a first thickness (or width) on a side face where the first peripheral areas 110D or the second peripheral areas 110E are not included, and may have a second thickness (or width), which is smaller than the first thickness, on a side face where the first peripheral areas 110D or the second peripheral areas 110E are included.

The electronic device 100 includes a display 101, audio modules 103, 107, and 114, sensor modules 104, 116, and 119, camera modules 105, 112, and 113, key input devices 117, light-emitting elements 106, and connector holes 108 and 109. Alternatively, at least one of the components ((e.g., the key input devices 117 or the light-emitting element 116) may be omitted, or other components may be additionally included.

The display 101 may be exposed through a large portion of the front plate 102. At least a portion of the display 101 may be exposed through the front plate 102 forming the front face 110A and the first peripheral areas 110D of the side faces 110C. The edges of the display 101 may be formed to be substantially the same as the contour shape of the front plate 102 adjacent thereto. Alternatively, the distance between the outer contour of the display 101 and the outer contour of the front plate 102 may be substantially constant in order to enlarge the exposed area of the display 101.

A recess or an opening may be formed in a part of a screen display area of the display 101, and at least one of an audio module 114, a sensor module 104, a camera module 105, and a light-emitting element 106 may be aligned with the recess or the opening. At least one of the audio module 114, the sensor module 104, the camera module 105, the fingerprint sensor 116, and the light-emitting element 106 may be included in the rear face of the screen display area of the display 101. The display 101 may be coupled to or disposed adjacent to a touch-sensing circuit, a pressure sensor capable of measuring the intensity of a touch (pressure), and/or a digitizer that detects an electromagnetic-field-type stylus pen. At least some of the sensor modules 104 and 119 and/or at least some of the key input devices 117 may be disposed in the first peripheral areas 110D and/or the second peripheral areas 110E.

The audio modules 103, 107, and 114 may include a microphone hole 103 and speaker holes 107 and 114. The microphone hole 103 may include a microphone disposed therein so as to acquire external sound. The microphone hole 103 may include multiple microphones disposed therein so as to sense the direction of sound. The speaker holes 107 and 114 may include an external speaker hole 107 and a phone call receiver hole 114. The speaker holes 107 and 114 and the microphone hole 103 may be implemented as a single hole, or a speaker (e.g., a piezo speaker) may be included without the speaker holes 107 and 114.

The sensor modules 104, 116, and 119 may generate electrical signals or data values corresponding to the internal operating state or the external environmental conditions of the electronic device 100. The sensor modules 104, 116, and 119 may include a first sensor module 104 (e.g., a proximity sensor) and/or a second sensor module (e.g., a fingerprint sensor) disposed on the front face 110A of the housing 110, and/or a third sensor module 119 (e.g., an HRM sensor) and/or a fourth sensor module 116 (e.g., a fingerprint sensor) disposed on the rear face 110B of the housing 110. The fingerprint sensor may be disposed on the front face 110A of the housing 110 (e.g., the display 101), and also on the rear face 110B.

The electronic device 100 may further include at least one additional sensor module, such as a gesture sensor, a gyro sensor, an air-pressure sensor, a magnetic sensor, an acceleration sensor, a grip sensor, a color sensor, an infrared (IR) sensor, a biosensor, a temperature sensor, a humidity sensor, or an illuminance sensor.

The camera modules 105, 112, and 113 may include a first camera device 105 disposed on the front face 110A of the electronic device 100, a second camera device 112 disposed on the rear surface 110B, and/or a flash 113. The camera modules 105 and 112 may include one or more lenses, an image sensor, and/or an image signal processor. The flash 113 may include a light-emitting diode or a xenon lamp.

Two or more lenses (e.g., an infrared camera lens, a wide-angle lens, and a telephoto lens), and image sensors may be disposed on one face of the electronic device 100.

The key input devices 117 may be disposed on the side faces. 110C of the housing 110. Alternatively, the electronic device 100 may omit some or all of the above-mentioned key input devices 117, and a non-included key input device 117 may be implemented in another form, such as a soft key on the display 101. The key input devices may include a sensor module 116 disposed on the rear face 110B of the housing 110.

The light-emitting element 106 may be disposed on the front face 110A of the housing 110. The light-emitting element 106 may provide the information about the status of the electronic device 100 in an optical form. Alternatively, the light-emitting element 106 may provide a light source that is interlocked with the operation of the camera module 105. The light-emitting element 106 may include a light-emitting diode (LED), an IR LED, and a xenon lamp.

The connector holes 108 and 109 may include a first connector hole 108 capable of accommodating a connector (e.g., a USB connector) for transmitting and receiving power and/or data to and from an external electronic device, and/or a second connector hole 109 capable of accommodating a connector (e.g., an earphone jack) for transmitting and receiving an audio signal to and from an external electronic device.

Figure 2:
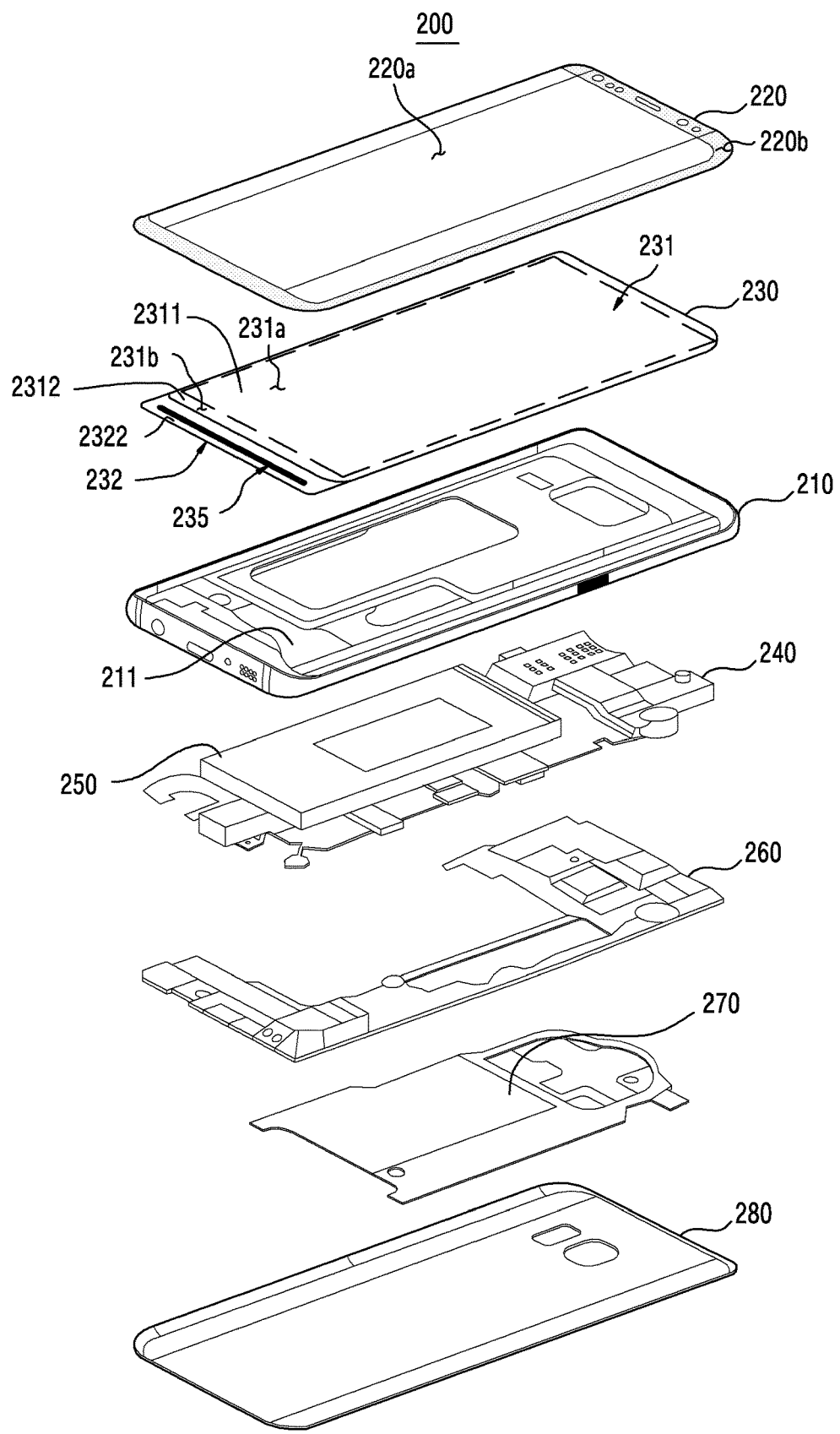
FIG. 2 illustrates an exploded perspective view of an electronic device according to an embodiment.

FIG. 2 illustrates an exploded perspective view of an electronic device according to an embodiment.

Referring to FIG. 2, an electronic device 200 includes a side bezel structure 210, a first support member 211 (e.g., a bracket), a front plate 220, a display 230, a printed circuit board 240, a battery 250, a second support member 260 (e.g., a rear case), an antenna 270, and a rear plate 280. Alternatively, at least one of the components (e.g., the first support member 211 or the second support member 260) may be omitted, or other components may be additionally included.

The first support member 211 may be disposed inside the electronic device 200 so as to be connected to the side bezel structure 210, or may be formed integrally with the side bezel structure 210. The first support member 211 may be formed of a metal material and/or a non-metal (e.g., polymer) material.

The display 230 may be coupled to one side of the first support member 211, and the printed circuit board 240 may be coupled to the other side of the first support member 311.

On the printed circuit board 240, a processor, a memory, and/or an interface may be mounted. The processor may include at least one of a central processing unit, an application processor, a graphic processor, an image signal processor, a sensor hub processor, or a communication processor.

The memory may include volatile memory or nonvolatile memory.

The interface may include a high-definition multimedia interface (HDMI), a universal serial bus (USB) interface, a secure digital (SD) card interface, and/or an audio interface. The interface may electrically or physically connect, for example, the electronic device 200 to an external electronic device, and may include a USB connector, an SD card/a multimedia card (MMC) connector, or an audio connector.

The battery 250 supplies power to at least one component of the electronic device 200, and may include a non-rechargeable primary battery, a rechargeable secondary battery, or a fuel cell. At least a part of the battery 250 may be disposed to be substantially flush with the printed circuit board 240. The battery 250 may be integrally disposed within the electronic device 200, or may be mounted to be detachable from the electronic device 200.

The second support member 260 may be coupled to the first support member 211, and may be disposed between the printed circuit board 240 and the rear plate 280. The second support member 260 may be coupled to the first support member 211 together with the printed circuit board 240, e.g., through bolt fastening or the like, and may serve to cover and protect the printed circuit board 240.

The antenna 270 may be disposed between the rear plate 280 and the display 250. The antenna 270 may include a near-field communication (NFC) antenna, a wireless charging antenna, and/or a magnetic secure transmission (MST) antenna. The antenna 270 is capable of performing short-range communication with an external device or transmitting and receiving power required for charging in a wireless manner. Alternatively, an antenna structure may be formed by the side bezel structure 210, a portion of the first support member 211, or a combination thereof.

The display 230 includes a panel 231 disposed below the front plate 220 (or a window), and a substrate 231 disposed below the panel 231. Although not illustrated, the panel 231 may include a light-emitting layer that forms multiple pixels and a thin film transistor (TFT) for controlling light of each pixel. The substrate 232 is a base plate on which the panel 231 is formed, and the panel 231 may be formed on the substrate 232 through a series of manufacturing processes.

The front plate 220 includes a transparent area 220a and an opaque area 220b.

The light-emitting layer of the panel 231 may be disposed along the transparent area 220a, and the light generated from the light-emitting layer of the panel 231 may be emitted to the outside through the transparent area 220a. The opaque area 220b corresponds to a periphery extending from the transparent area 220a to a side member (e.g., the bezel structure 118), and may form a bezel area separated from a screen area defined by the transparent area 220a. The light-emitting layer of the panel 231 may be formed so as not to overlap the opaque area 220b. A part of the light-emitting layer of the panel 231 may overlap the opaque area 220b and may be set to be disabled or inactive.

The panel 231 includes a first panel part 2311 disposed below the transparent area 220a of the front plate 220 and a second panel part 2312 disposed below the opaque area 220b of the front plate 220. The second panel part 2312 may correspond to the periphery of the panel 231. A component including the light-emitting layer and the TFT may extend to at least a portion of the second panel part 2312, or may not be included in the second panel part 2312. Although a dot line, which distinguishes the first panel part 2311 and the second panel part 2312, is indicated in order to help understanding, the first panel part 2311 and the second panel part 2312 are not limited thereto and may be modified in various other forms.

The panel 231 may be bonded to the front plate 220 using an optical adhesive member. The optical adhesive member may be formed of a photocurable resin, which is cured by reacting to light of a specified band (e.g., ultraviolet rays), and may be light-transmissive. The upper surface 231a and 231b of the panel 231 bonded to the rear face of the front plate 220 includes a first face 231a formed by the first panel part 2311, and a second face 231b formed by the second panel part 2312. When the optical adhesive member is placed between the upper face 231a and 231b of the panel 231 and the rear face of the front plate 220 and is then cured, the panel 231 and the front plate 220 can be bonded to each other.

The substrate 232 may include a first area bonded to the panel 231 and a second area 2322 disposed below the opaque area 220b of the front plate 220 with a separation space interposed therebetween.

The electronic device 200 may include a filler member filling at least a part of the space formed between the opaque area 220b of the front plate 220 and the second area 2322 of the substrate 232. The second area 2322 of the substrate 232 is bonded to the front plate 220 by the filler member, so that the mechanical strength for the second area 2322 of the substrate 232 can be increased. The filler member may be disposed such that a separation space is interposed between the filler member and the panel 231. Of course, the second area 2322 of the substrate 232 may be disposed at a position different from the position illustrated in FIG. 2.

The front plate 220 may be bonded to the display 230 by placing the optical adhesive member on the panel 231 of the display 230, temporarily curing the optical adhesive member, placing the filler member on the substrate 232, placing the front plate 220 at a position set relative to the display 230, and fully curing the optical adhesive member. When at least a part of the filler member includes a material, such as a resin, that is cured by reacting to light of a specified band (a photocurable resin), operations of temporarily curing the filler member and fully curing the filler member may be further included.

Herein, the phrase "temporarily curing" refers to the state in which the fluidity of a composition is controlled. For example, the temporarily cured optical adhesive member or filler member may be arranged in a set shape while maintaining adhesive force or adhesiveness. The operation of temporarily curing the fill member can be performed after the operation of placing the front plate 220 at the position set relative to the display 230. The operation of fully curing the filler member may be performed simultaneously with the operation of fully curing the optical adhesive member.

The filler member may also be formed of a material that requires post-curing without pre-curing such as temporary curing. In this case, the operation of temporarily curing the filler member may be omitted.

When light of a specified band output from a radiation apparatus is radiated onto a structure including the front plate 220, the display 230, the temporarily cured optical adhesive member, and the temporarily cured filler member, the light passes through the transparent area 220a of the front plate 220 and reaches a portion of the temporarily cured optical adhesive member disposed along the transparent area 220a, whereby the portion of the optical adhesive member can be fully cured.

The light from the radiation apparatus may be blocked or attenuated by the opaque area 220b of the front plate 220, and therefore, it may be difficult to fully cure the other portion of the temporarily cured optical adhesive members aligned with the opaque area 220b of the front plate 220.

The display 230 includes a display driver 235, such as a display driver integrated circuit (DDI), configured to control the multiple pixels of the panel 231. The display driver 235 may be coupled to the second area 2322 of the substrate 232, and may be disposed between the substrate 232 and the front plate 220. A bonding pad electrically connected to a TFT of the panel 231 may be formed in the second area 2322 of the substrate 232, and the display driver 235 may be electrically connected to the bonding pad using soldering. At least a portion of the filler member may be disposed between the display driver 235 and the front plate 220.

A limited clearance between the display driver 235 and the front plate 220 makes it difficult to secure a sufficient amount of light required to fully cure the portion of the temporarily cured optical adhesive member aligned with the opaque area 220b of the front plate 220.

In order to secure a sufficient amount of light to fully cure the optical adhesive member, it is possible to design the filler member to have a set light transmittance. Light from the radiation apparatus is capable of reaching the optical adhesive member through the filler member, whereby the optical adhesive member can be fully cured.

In order to secure a sufficient amount of light to fully cure the optical adhesive member, multiple filler members may be disposed with a clearance therebetween. The light from the radiation apparatus is capable of reaching the optical adhesive member through the clearance between the multiple filler members, whereby the optical adhesive member can be fully cured.

The filler member may include a material that emits light when optically stimulated in order to secure a sufficient amount of light to fully cure the optical adhesive member. When the light from the radiation apparatus is applied to the filler member, the filler member may not only be fully cured, but may also emit light. The light from the filler member is applied to the optical bonding member, whereby the optical adhesive member can be fully cured.

In a structure composed of the front plate 220, the display 230, the temporarily cured optical adhesive member, and the temporarily cured filler member, various other structures associated with the filler member may be designed to secure a sufficient amount of light required to fully cure a portion of the optical adhesive member aligned with the opaque area 220b of the front plate 220.

Figure 3:
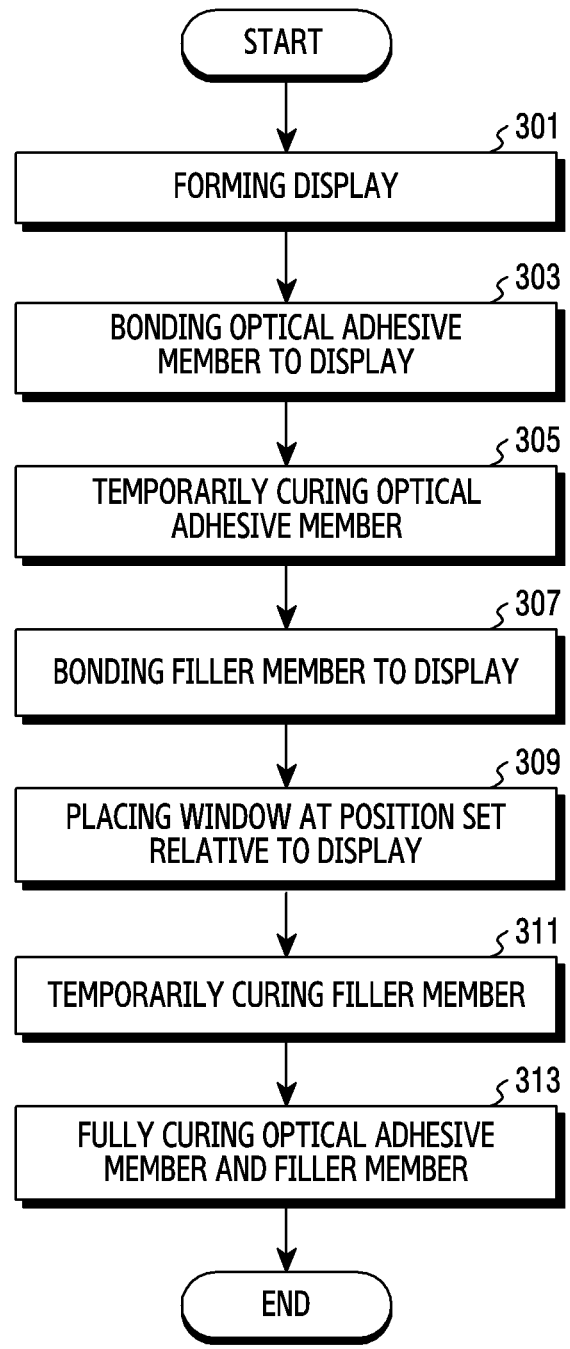
FIG. 3 is a flowchart illustrating a display module manufacturing method according to an embodiment.

FIG. 3 is a flowchart illustrating a display module manufacturing method according to an embodiment.

Referring to FIG. 3, a display is formed in step 301.

Figure 4A:
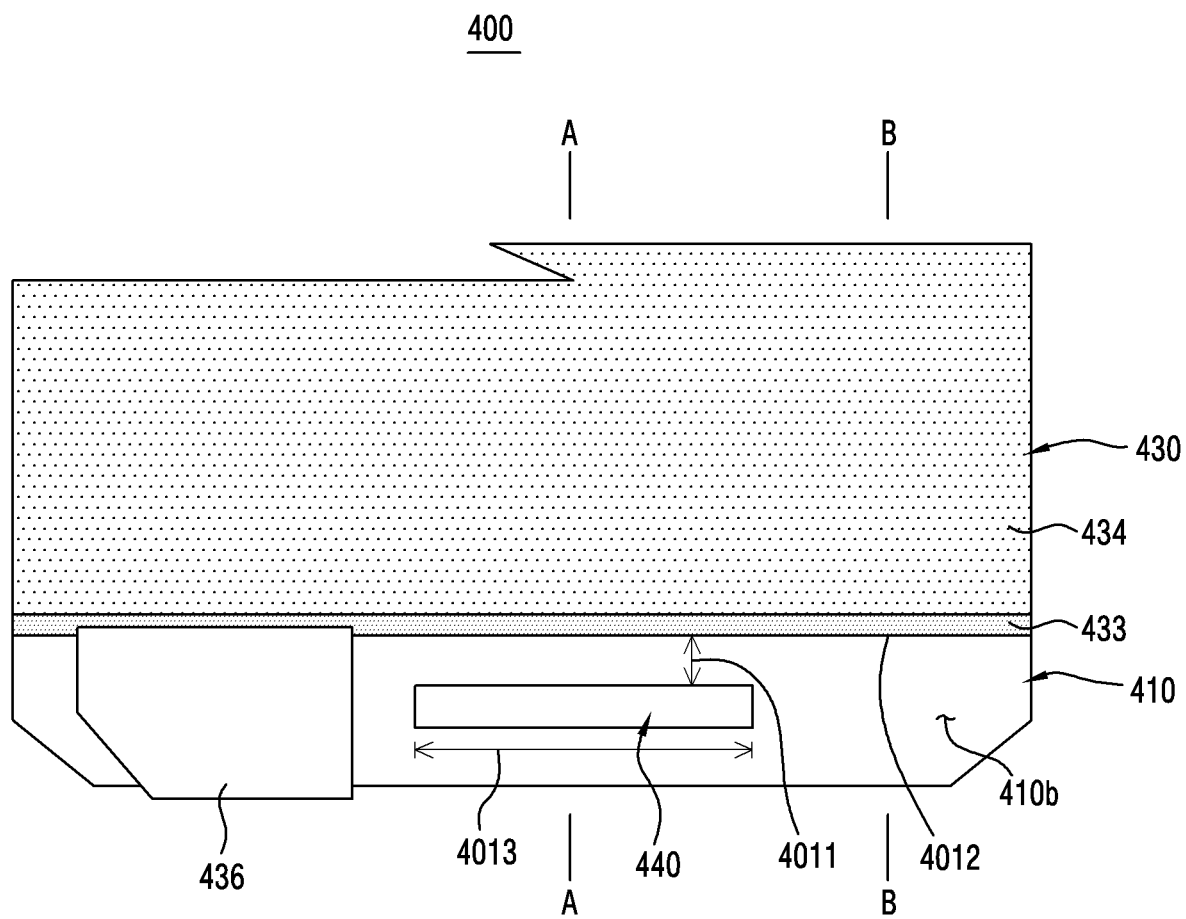
FIG. 4A illustrates a plan view of a display according to an embodiment.

FIG. 4A illustrates a plan view of a display according to an embodiment.

Referring to FIG. 4A, the display 400 includes a first substrate 410, a panel 430, and a display driver 440. The first substrate 410 may include a first area coupled with a panel 430 and a second area 410*b* coupled with the display driver 430.

The panel 430 may include a light-emitting layer, an encapsulation 433 configured to prevent the light-emitting layer from being affected by the outside, and an optical layer 434 such as a polarizer disposed above the encapsulation 433.

The display driver 440 may be spaced apart from one linear side face 4012 of the panel 430 by a first distance 4011 and may have a second length 4013 extending along the side face 4012.

The display 400 includes a connection portion 436 disposed on a second substrate 420. The connection portion 436 may be used to electrically connect the printed circuit board of the electronic device on which the display 400 is mounted and the display driver 440 of the electronic device using a flexible printed circuit board (FPCB).

Figure 4B:
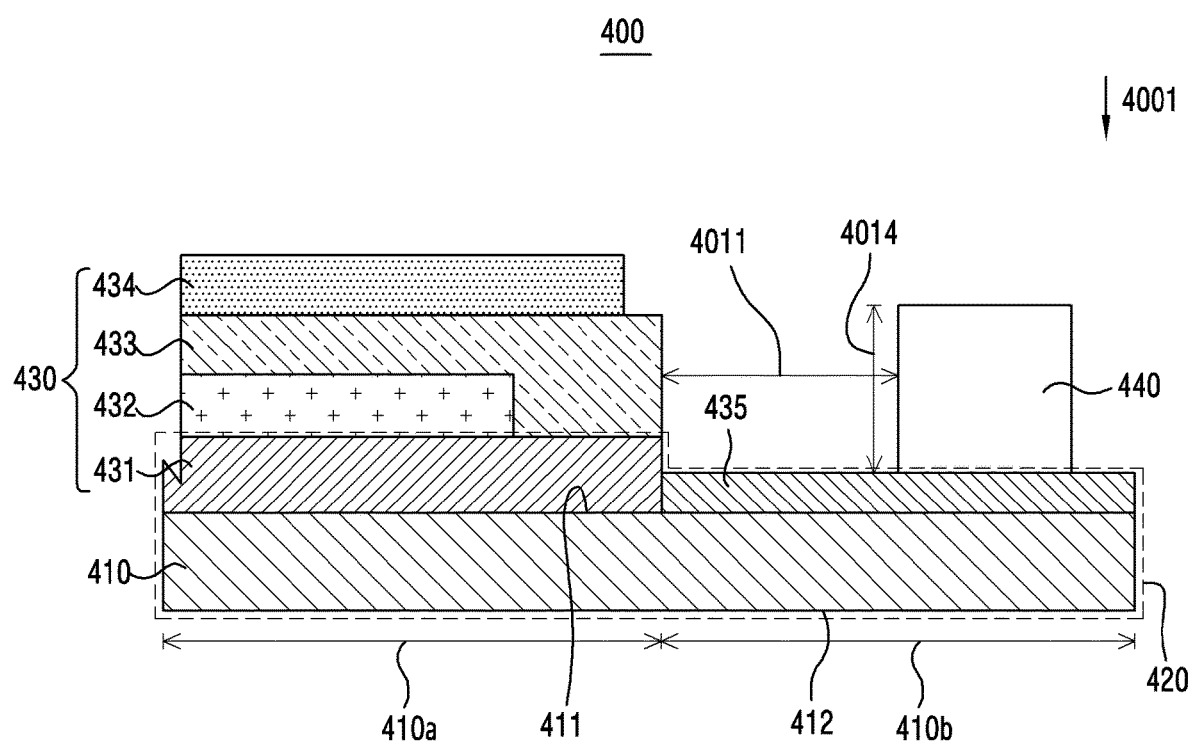
Figure 4C:
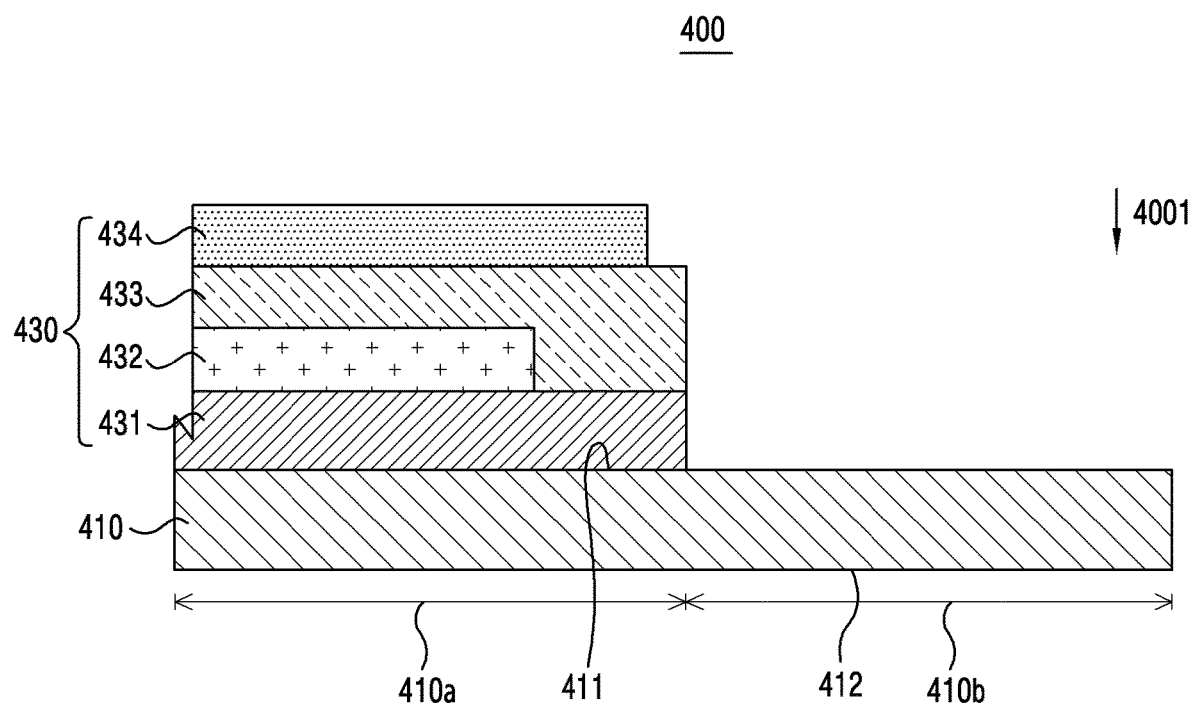
FIG. 4C illustrates a cross-sectional view of the display taken along line B-B in FIG. 4A.

FIG. 4B illustrates a cross-sectional view of the display taken along line A-A in FIG. 4A, and FIG. 4C is a cross-sectional view of the display taken along line B-B in FIG. 4A.

Referring to FIGS. 4B and 4C, when an element A, an element B, and an element C are disposed in order in a first direction 4001, the element A is disposed above the element B and that the element C is disposed below on the element B. A face oriented in the first direction 4001 in the plate may be defined as a rear face (or a lower face), and a face oriented in the direction opposite the first direction 4001 in the plate may be defined as an upper face. A face surrounding the space between the upper and lower faces of the plate may be defined as a side face.

The first substrate 410 may be in the form of a plate including two sides 411 and 412. The first substrate 410 may be formed as a rigid substrate using a material such as glass. When the display 400 is designed as a flexible display, the first substrate 410 is formed as a flexible substrate using a flexible plastic material such as polyimide (PI).

The panel 430 includes a TFT 431 and a light-emitting layer 432 that forms a plurality of pixels controlled by the TFT 431. The TFT 431 may be disposed between the light-emitting layer 432 and the first substrate 410, and the layers included in the TFT 431 may be formed on the upper face 411 of the first substrate 410 through a series of processes such as deposition, patterning, and etching. For example, an active layer (or a semiconductor layer) formed of a semiconductor material such as poly-silicon may be formed on the upper face 411 of the first substrate 410, and a gate electrode, a source electrode, and a drain electrode for driving the active layer may be formed. The source electrode may supply electrons, and the drain electrode may receive electrons. The gate electrode may control the movement of electrons from the source electrode to the drain electrode. The active layer may be electrically connected to the source electrode and the drain electrode, and may serve as a path (or a channel) through which electrons move, like a conductor when voltage is applied to the gate electrode.

The light-emitting layer 432 may include an organic light-emitting diode (OLED), and the light-emitting layer 432 may include an anode, a cathode, and an organic material layer, which are on formed on the TFT 431 through vapor deposition. The anode is an electrode that emits holes, the cathode is an electrode that emits electrons, and the organic material layer may be disposed between the anode and the cathode.

Due to the reaction of the active layer of the TFT 431, current may flow to the source electrode, the active layer, and the drain electrode, and voltage may be applied to the anode and the cathode of the light-emitting layer 432 electrically connected to the TFT 431. As a result, the electrons emitted from the anode and the holes emitted from the cathode are combined in the organic material layer, and exciton energy generated due to the combination of electrons and holes may be emitted in the form of light from the organic material layer. The light-emitting layer 432 including such an OLED may be defined as an organic light-emitting layer.

Alternatively, the light-emitting layer 432 may be replaced with a light-emitting element having a structure different from that of the OLED.

The TFT 431 may include low-temperature polycrystalline silicon (LTPS) or amorphous silicon (a-Si).

The panel 430 includes an encapsulation 433 that prevents the light-emitting layer 432 from being externally affected. Since the organic material layer, the anode, or the cathode included in the light-emitting layer 432 may lose the light-emitting characteristic thereof by reacting with oxygen or moisture, the encapsulation 433 is capable of preventing the penetration of oxygen or moisture into the light-emitting layer 432 as a seal that prevents the light-emitting layer 432 from being exposed. The encapsulation 433 may include a thin film encapsulation (TFE).

The panel 430 further includes an optical layer 434 disposed on the encapsulation 433. The optical layer 434 may include a phase retardation layer (or a phase retarder) and a polarizing layer (or a polarizer) disposed on the phase retardation layer. When non-polarized light, such as sunlight, is incident on the display 400, the non-polarized light passes through a polarizing layer such that the non-polarized light may be converted into linearly polarized light. The linearly polarized light passes through the phase retardation layer such that the linearly polarized light may be converted into circularly polarized light. For example, when non-polarized light passes through a 90-degree-polarization layer, the non-polarized light may be converted into 90-degree-linearly polarized light, and when 90-degree-linearly polarized light passes through a 45-degree-phase retardation layer, the 90-degree-linearly polarized light may be converted into 135-degree-circularly polarized light. The 135-degree-circularly polarized light may have a value between 90 degrees and 180 degrees, which are linear polarization axes, and may oscillate along both the x and y axes, that is, with 90-degree and 180-degree phases. The circularly polarized light is not placed on a specific axis, and is able to change the axis while evenly oscillating. The phase retardation layer may have the characteristic of a quarter wave retarder ($\lambda/4$ retarder).

When sunlight is incident on the display 400, at least a part of the light may be reflected from an electrode included in the display 400 or the like, which may cause a difficulty in screen recognition. The polarizing layer and the phase retardation layer of the optical layer 434 are able to prevent outdoor light from being reflected, thereby improving outdoor visibility. For example, the light of 135-degree-circularly polarized light converted by the phase retardation layer may be reflected from the TFT 431, the reflected 135-degree-circularly polarized light may be converted into 180-degree-linearly polarized light through the phase retardation layer, and it may be impossible to emit the 180-degree-linearly polarized light to the outside through the 90-degree-polarizing layer. A single layer obtained by combining a polarizing layer and a phase retardation layer may be provided, and such a layer may be referred to as a "circularly polarizing layer".

The panel 430 may further include various other layers. For example, the panel 430 may include a buffer layer formed of a material, such as silicon oxide or silicon nitride, disposed between the TFT 431 and the first substrate 410. As another example, the panel 430 may include a protection layer formed of a polymer or the like disposed between the buffer layer and the first substrate 410.

The display 400 may be any of various displays based on TFT 431, and may include an active matrix organic light-emitting diode (AMOLED) display, a passive matrix organic light-emitting diode (PMOLED) display, a liquid crystal display (LCD), etc.

Depending on the type of the display 400 illustrated in FIG. 4, at least one of the above-mentioned displays may be omitted from the display 400, or other components may be added to the display 400.

The display driver 440, e.g., a display driver integrated circuit (DDI), may be set to control the multiple pixels of the light-emitting layer 432, and may be coupled with the first substrate 410. The display driver 440 may adjust the TFT 431 electrically connected to the light-emitting layer 432 including the multiple pixels under the control of the processor of the electronic device. The display driver 440 may be spaced apart from the panel 430 by the first distance 4011, and may have a height 4014 in the first direction 4001.

The first substrate 410 may include a first area 410a coupled with a panel 430 and a second area 410b coupled with the display driver 430.

A bonding pad 435, which is electrically connected to the TFT 431 and is used to mount the display driver 440, may be formed on the upper face 411 of the first substrate 410 through vapor deposition or the like.

The display driver 440 turns a pixel on or off, and may be electrically connected to a gate electrode of the TFT 431. The display driver 440 may adjust the amount of red, green, and blue (RGB) signals of the pixel in order to generate a particular color difference, and may be electrically connected to the source electrode of the TFT 431.

The TFT 431 may include a gate line electrically connecting the display driver 440 and the gate electrode of the TFT 431 and a source line (or a data line) electrically connecting the display driver 440 and the source electrode of the TFT 431. The gate line and the source line may be electrically connected to the bonding pad 435.

The bonding pad 435 may be formed on the first substrate 410 based on LTPS or a-Si, together with the TFT 431. The structure including the TFT 431, the bonding pad 435, and the first substrate 410 may be defined as a second substrate 420.

In FIG. 4A or FIG. 4B, a chip-on-panel (COP) structure in which the display driver 440 is coupled to the second substrate 420 is illustrated. However, it is also possible to implement various types of structures, such as a chip-on-film, in which an FPCB on which the display driver 440 is mounted is provided and the FPCB is connected to the second substrate 420 using a flexible film.

Referring back to FIG. 3, in step 303, an optical adhesive member is bonded to the display.

Figure 5A:
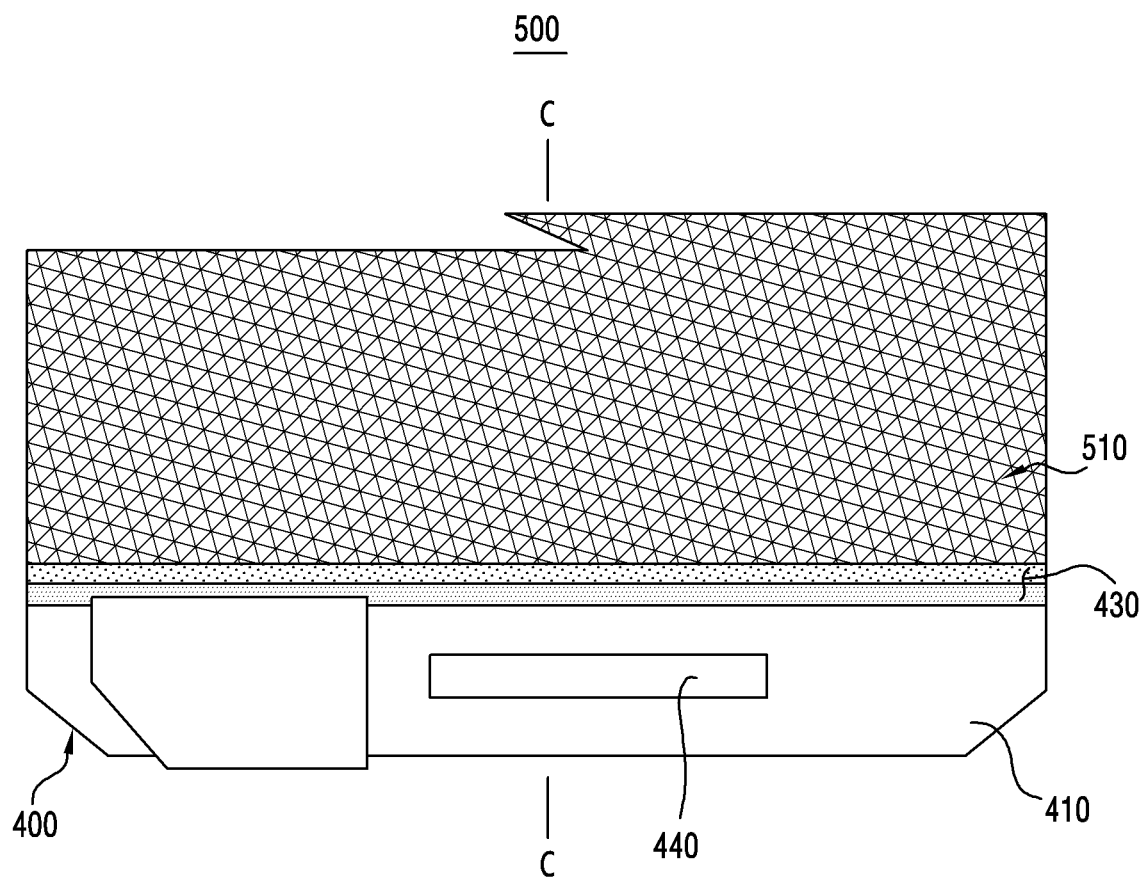
FIG. 5A illustrates a plan view of a first structure including a display and an optical adhesive member according to an embodiment.

FIG. 5A illustrates a plan view of a first structure including a display and an optical adhesive member according to an embodiment.

Referring to FIG. 5A, the display 400 includes a first substrate 410, a panel 430, and a display driver 440, and the first structure 500 in which the optical adhesive member 510 is bonded to the panel 430 may be formed.

Figure 5B:
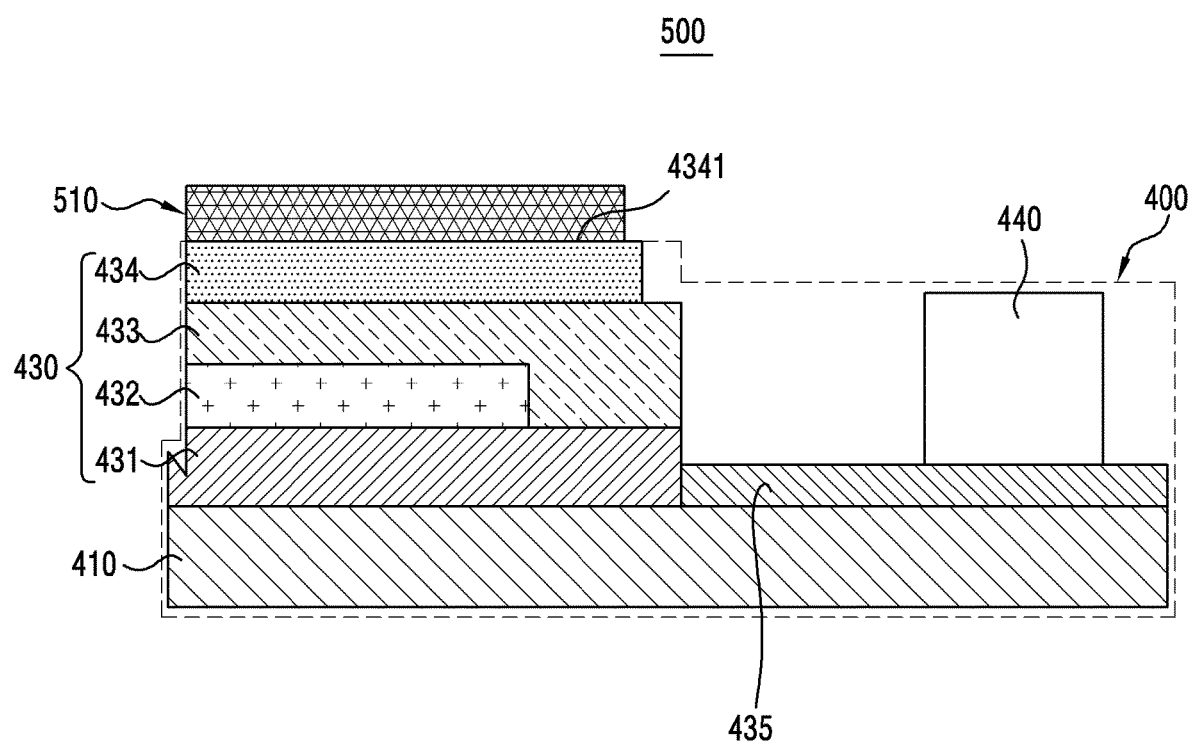
FIG. 5B illustrates a cross-sectional view of the first structure taken along line C-C in FIG. 5A.

FIG. 5B is a cross-sectional view of the first structure taken along line C-C in FIG. 5A.

Referring to FIG. 5B, the display 400 includes a first substrate 410, a panel 430, a bonding pad 435, and a display driver 440, and the panel 430 includes a TFT 431, a light-emitting layer 432, an encapsulation 433, and an optical layer 434. The optical bonding member 510 may be disposed on the upper face 4341 of the optical layer 434 of the panel 430. The optical adhesive member 510 may contain a material that is cured by reacting to light of a specified band (e.g., ultraviolet light), such as optical clear adhesive (OCA), optical clear resin (OCR), or super view resin (SVR). The optical adhesive member 510 may contain a material that is capable of maintaining high transparency even in a high temperature or high humidity environment. The optical adhesive member 510 may contain a material having a high oxygen and moisture barrier rate, and may play a role, which is at least similar or the same as that of the encapsulation 433.

Referring back to FIG. 3, the optical adhesive member is temporarily cured in step 305.

Figure 6:
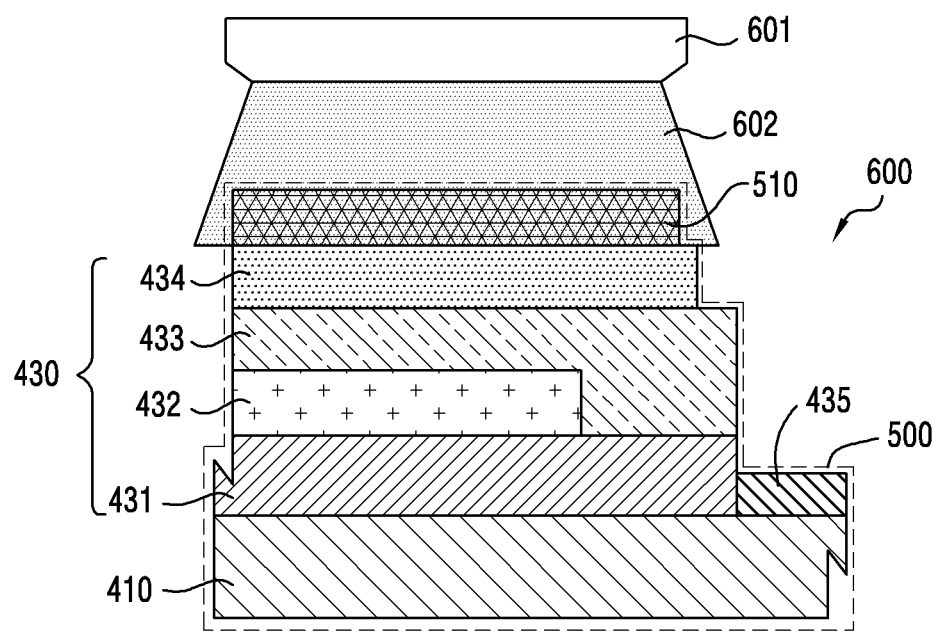
FIG. 6 illustrates the display module manufacturing method of FIG. 3.

FIG. 6 illustrates the display module manufacturing method of FIG. 3.

Referring to FIG. 6, light 602 of a specified band, which is output from the radiation apparatus 601 may be radiated to a first structure 500 including a display (e.g., a structure including the first substrate 410, the panel 430, and the bonding pad 435) and the optical adhesive member 510, whereby a second structure 600 in which the optical adhesive member 510 is temporarily cured, may be formed. As described above, the phrase "temporary curing" refers to a state in which the fluidity of the composition of the optical adhesive member 510 is controlled, and the optical adhesive member 510 may be disposed in a predetermined form while maintaining adhesive force or adhesion.

Referring back to FIG. 3, a filler member is coupled to the display in step 307.

Figure 7A:
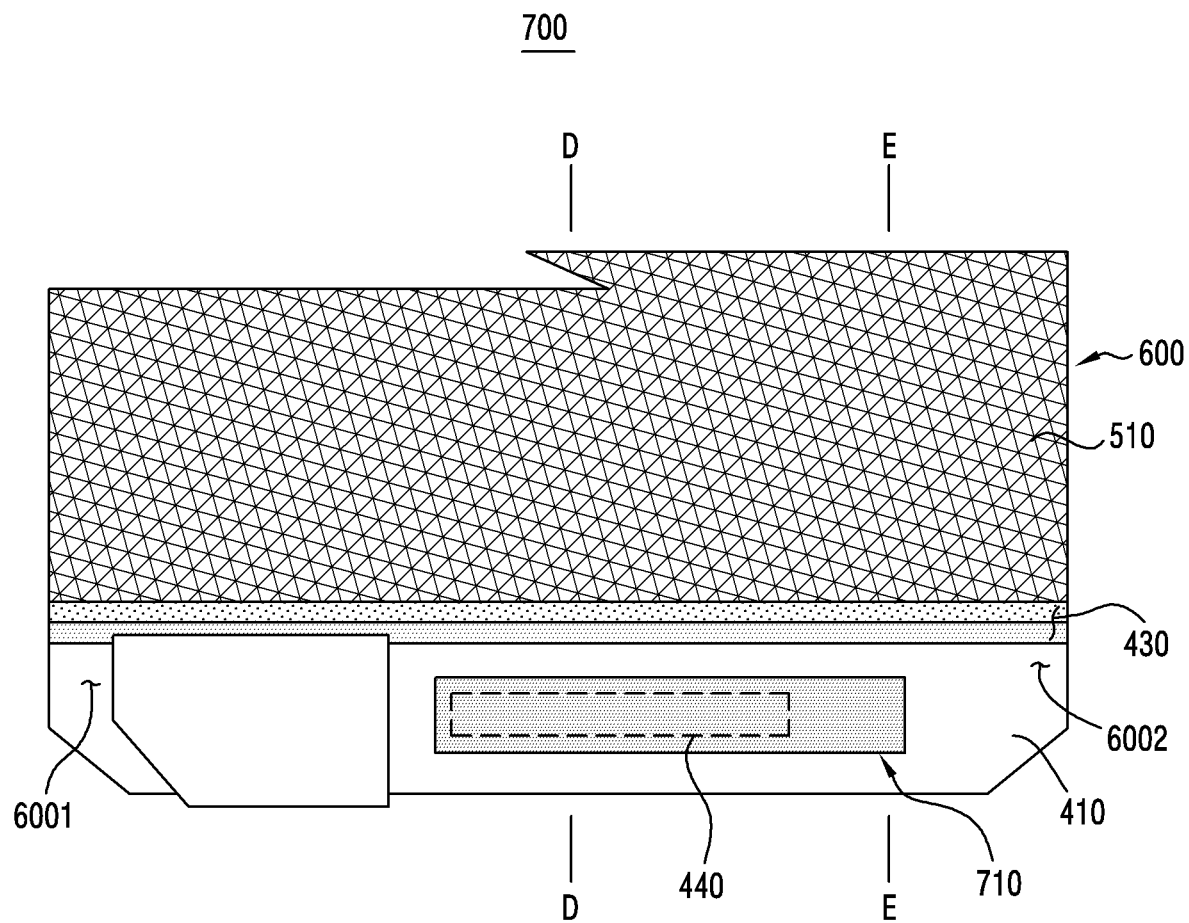
FIG. 7A illustrates a plan view of a third structure including a second structure and a filler member 710 according to an embodiment.

FIG. 7A illustrates a plan view of a third structure including a second structure and a filler member according to an embodiment.

Referring to FIG. 7A, the second structure 600 includes a display including a first substrate 410, a panel 430, and a display driver 440, and an optical adhesive member 510 bonded to the display and temporarily cured. The filler member 710 may be coupled to the first substrate 410 of the second structure 600 so as to cover the display driver 440, thereby forming the third structure 700.

Figure 7B:
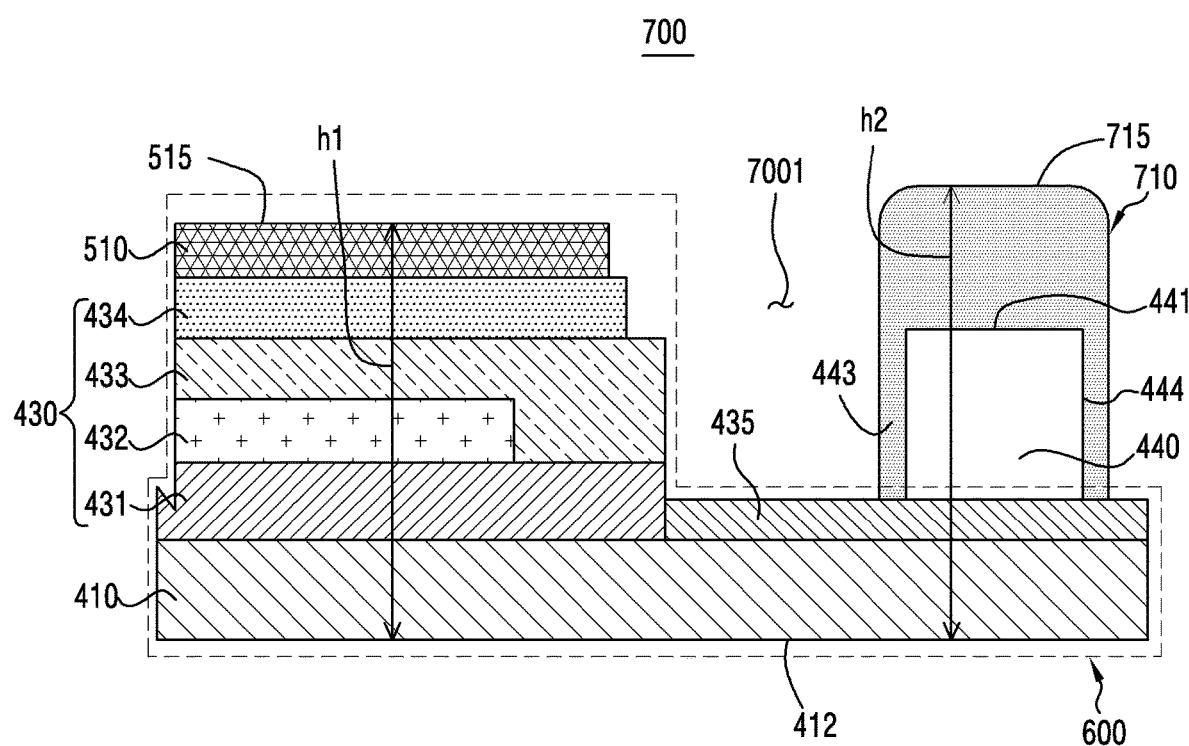
FIG. 7B illustrates a cross-sectional view of the third structure taken along line D-D in FIG. 7A.

FIG. 7B illustrates a cross-sectional view of the third structure taken along line D-D in FIG. 7A.

Referring to FIG. 7B, the second structure 600 includes a display including a TFT 431, a light-emitting layer 432, an encapsulation 433, an optical layer 434, a bonding pad 435, and a display driver 440, and an optical adhesive member 510 temporarily bonded to the optical layer 434. In the third structure 700, the filler member 710 may be coupled to the first substrate 410 with a separation space 7001 interposed between the panel 430 of the second structure 600 and the temporarily cured optical member 510.

The filler member 710 may cover at least a portion of the display driver 440. For example, the display driver 440 may include an upper face 441 that faces away from the lower face 412 of the first substrate 410, and the filler member 710 may cover the upper face 441. The display driver 440 may include a first side face 443 facing the panel 430, a second side face 444 facing away from the first side face 443, and a third side face and a fourth side face, perpendicular to the first side face 443 or the second side face 444, and facing away from each other. The filler member 710 may cover at least one of the first side face 443, the second side face 444, the third side face, and the fourth side face. When viewed in the cross-sectional view, the bonding pad 435 is disposed between the display driver 440 and the first substrate 410, and a portion of the filler member 710 covers the bonding pad 435.

Figure 7C:
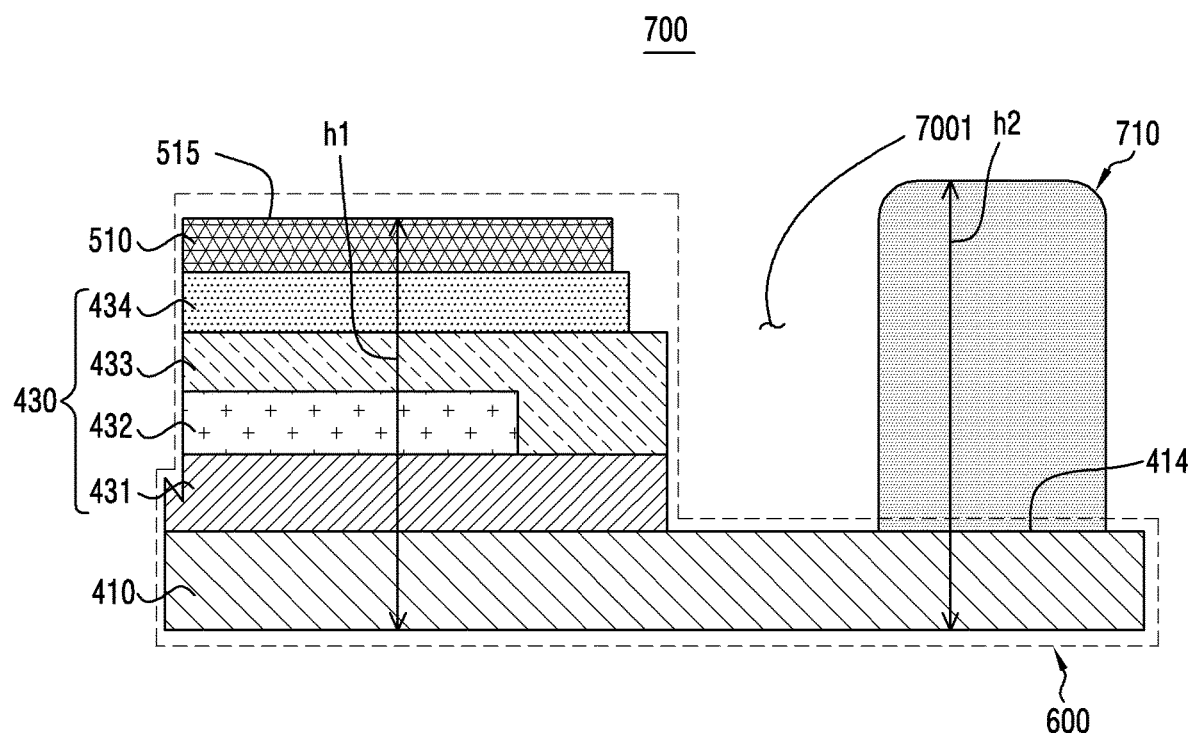
FIG. 7C illustrates a cross-sectional view of the third structure taken along line E-E in FIG. 7A.

FIG. 7C illustrates a cross-sectional view of the third structure taken along line E-E in FIG. 7A.

Referring to FIG. 7C, the first substrate 410 of the third structure 700 includes an area 414 in which a display driver is not disposed, and the filler member 710 may cover a portion of the area 414 with a separation space 7001 interposed between the panel 430 of the second structure 600 and the temporarily cured optical member 510.

Referring to FIG. 7B or 7C, the optical adhesive member 510 includes an upper face 515 that faces away from the lower face 412 of the first substrate 410 and is disposed at a second distance h1 from the first substrate 410. The filler member 710 may be formed to have an upper face disposed at a third distance h2, which is equal to or longer than the second distance h1, from the first substrate 410.

At least a portion of the filler member 710 may have a light transmittance that is not lower than a specified range. The filler member 710 may contain a material such as a resin that is cured by reacting to light of a specified band (e.g., ultraviolet light).

Referring back to FIG. 3, in step 309, a window is placed at a position set relative to the display.

Figure 8A:
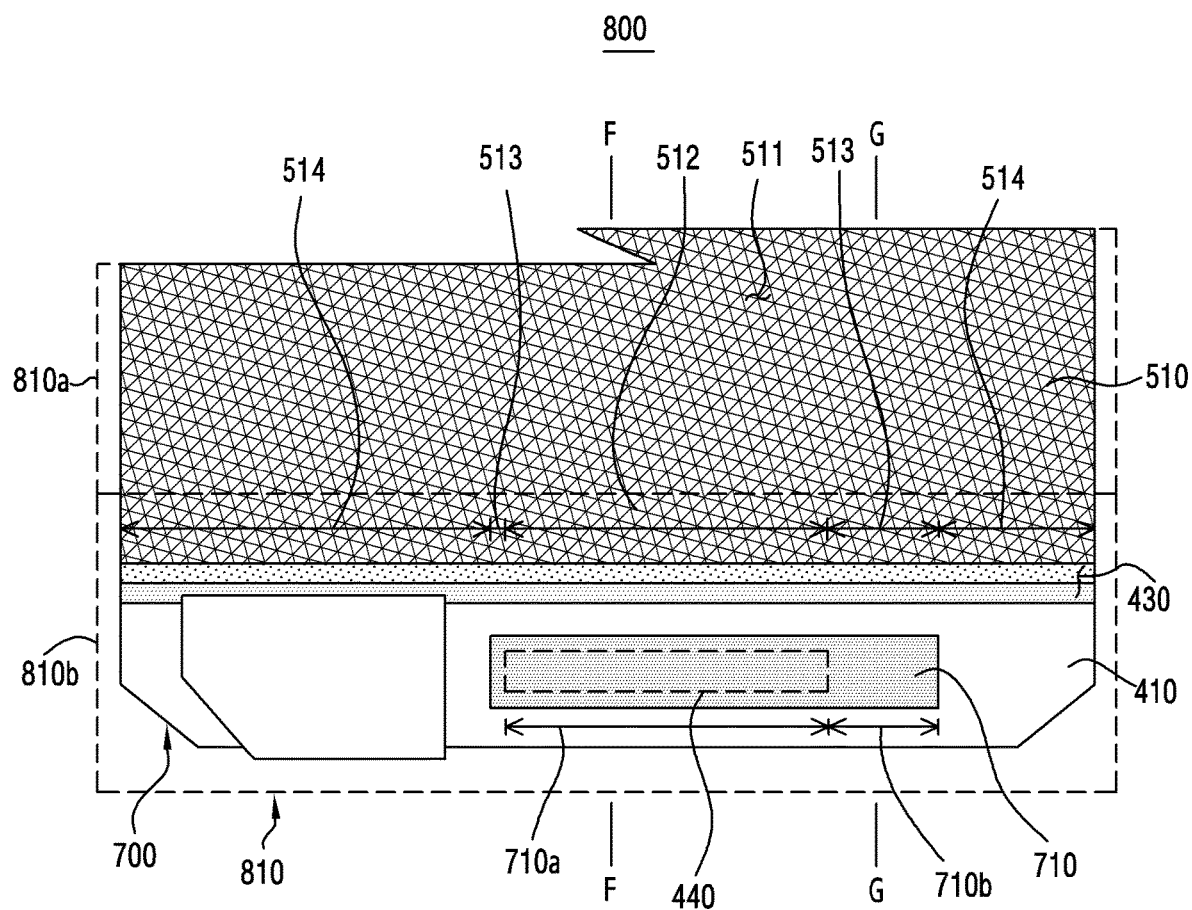
FIG. 8A illustrates a plan view of a fourth structure including a third structure and a window according to an embodiment.

FIG. 8A illustrates a plan view of a fourth structure including a third structure and a window according to an embodiment.

Referring to FIG. 8A, the third structure 700 includes a first substrate 410, a panel 430, a display driver 440, a temporarily cured adhesive member 510, and an uncured filler member 710. The fourth structure 800 may be formed by placing the window 810 at a position set relative to the third structure 700. In the fourth structure 800, the window 810 and the first substrate 410 may be substantially parallel to each other. In the fourth structure 800, the temporarily cured optical adhesive member 510 and the uncured filler member 710 may be adhered to the window 810.

The temporarily cured optical adhesive member 510 in the fourth structure 800 includes a first portion 511, which is aligned with a transparent area 810a of the window 810, and a second portion 512, a third portion 513, and a fourth portion 514, which are aligned with an opaque area 810b of the window 810.

The second portion 512 may be a portion corresponding to a portion 710a of the filler member 710 disposed between the window 810 and the display driver 440. The third portion 513 may be a portion corresponding to a portion 710b of the filler member 710 disposed between the first substrate 410 and the window 810. The fourth portion 514 may be a portion corresponding to an empty space between the window 810 and the first substrate 410.

Figure 8B:
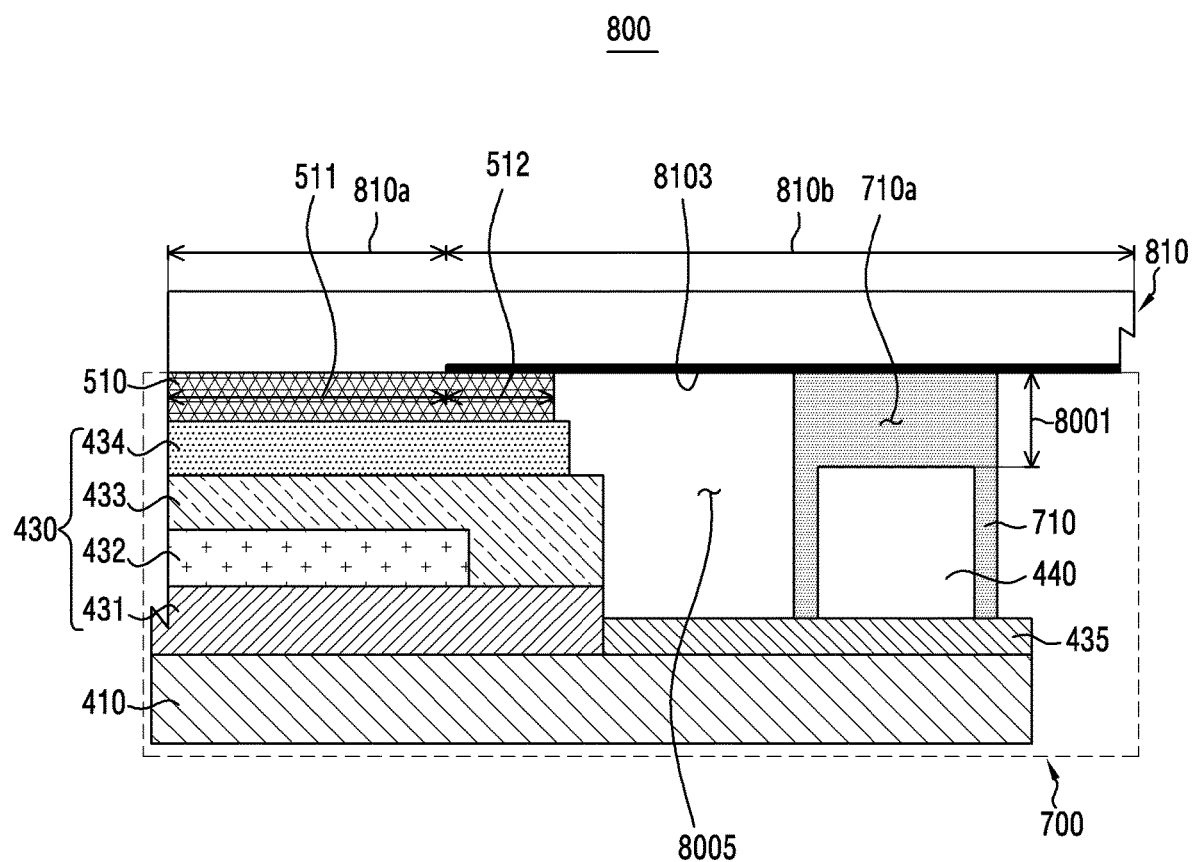
FIG. 8B illustrates a cross-sectional view of the fourth structure taken along line F-F in FIG. 8A.
Figure 8C:
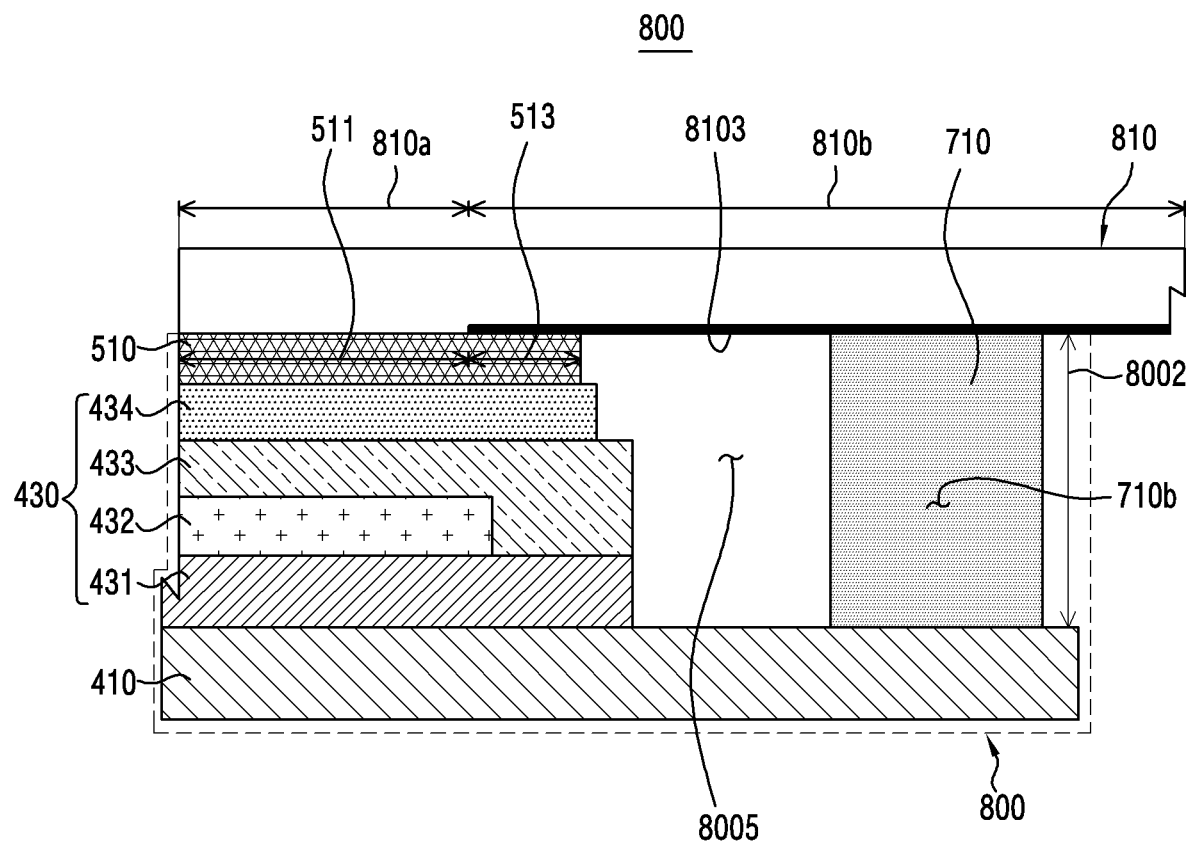
FIG. 8C illustrates a cross-sectional view of the fourth structure taken along line G-G in FIG. 8A.

FIG. 8B illustrates a cross-sectional view of the fourth structure taken along line F-F in FIG. 8A, and FIG. 8C is a cross-sectional view of the fourth structure taken along line G-G in FIG. 8A.

Referring to FIGS. 8B and 8C, the fourth structure 800 includes the third structure 700 including the first substrate 410, the panel 430, the display driver 440, the bonding pad 435, the temporarily cured optical adhesive member 510, and the uncured filler member 710, and a window 810 adhered to the optical adhesive member 510 and a filler member 710. When the fourth structure 800 is formed, depending on the volume of the filler member 710 relative to the space 8001 between the window 810 and the display driver 440, the filler member 710 may be disposed to be deformed plastically. On this basis, a space 8005 in which the uncured filler member 710 is spaced apart from the panel 430 and the temporarily cured optical adhesive member 510 in the fourth structure 800 may be determined.

At least a portion of the filler member 710 may have fluidity so as to compactly fill the empty space between the window 810 and the first substrate 410. For example, at least a portion of the filler member 710 may have a modulus of, e.g., $10^5$ Pa or lower.

A transparent member may be further disposed in the separation space 8005. The transparent member may contain a material such as a resin that is cured by reacting to light of a specified band (e.g., ultraviolet light). The transparent member may be formed of the same material as the optical adhesive member 510. The transparent member may be a portion of the optical adhesive member 510 overflowing into the separation space 8005 when the fourth structure 800 is formed.

When the fourth structure 800 is formed, depending on the volume of the filler member 710 relative to the space 8001 between the window 810 and the display driver 440, the filler member 710 may be disposed to be deformed plastically.

The window 810 may include a transparent area 810a and an opaque area 810b. The light-emitting layer 432 of the panel 430 may be disposed along the transparent area 810a, and the light generated from the light-emitting layer 432 of the panel 430 may be emitted to the outside through the transparent area 810a. The opaque area 810b corresponds to the periphery of the window 810 extending from the transparent area 810a, and the light-emitting layer 432 of the panel 430 may not overlap the opaque area 810b. A portion of the emission layer 432 of the panel 430 may overlap the opaque area 810b and may be set to be disabled or inactive.

The opaque area 810b of the window 810 may be formed in the manner of additionally attaching a pattern layer or additionally printing a color layer on the lower face 8103 thereof. Alternatively, the opaque area 810b of the window 810 may be formed in various other structures.

The temporarily cured optical adhesive member 510 in the fourth structure 800 includes a first portion 511, which is aligned with the transparent area 810a of the window 810, and a second portion 512, a third portion 513, and a fourth portion 514, which are aligned with the opaque area 810b of the window 810. External light incident on the window 810 may reach the first portion 511 through the transparent area 810a. Since the second portion 512, the third portion 513, and the fourth portion 514 are covered by the opaque area 810b, it may be difficult for the external light incident on the window 810 to reach the second portion 512, the third portion 513, and the fourth portion 514.

The second portion 512 may be a portion corresponding to the portion 710a of the filler member 710 disposed in the first space 8001 between the window 810 and the display driver 440. The third portion 513 may be a portion corresponding to the portion 710b of the filler member 710 disposed in a second space 8002 between the first substrate 410 and the window 810. The fourth portion 514 may be a portion corresponding to an empty space (not illustrated) between the window 810 and the first substrate 410.

Referring again to FIG. 7A, the third structure 700 may be modified to further include second filler members disposed in both portions 6001 and 6002 of the sixth structure 600. The second filler members may be cured to be bonded to the window 810, the optical adhesive member 510, the optical layer 434, or the encapsulation 433. When the display 400 having the structure in which the panel 430 including the multiple pixels is bonded to the first substrate 410 is bonded to the window 810, the second filler members are capable of increasing the rigidity or durability of bonding together with the filler member 710. Alternatively, the second filler members may be disposed at various other positions.

Referring back to FIG. 3, a filler member is temporarily cured in step 311.

Figure 9:
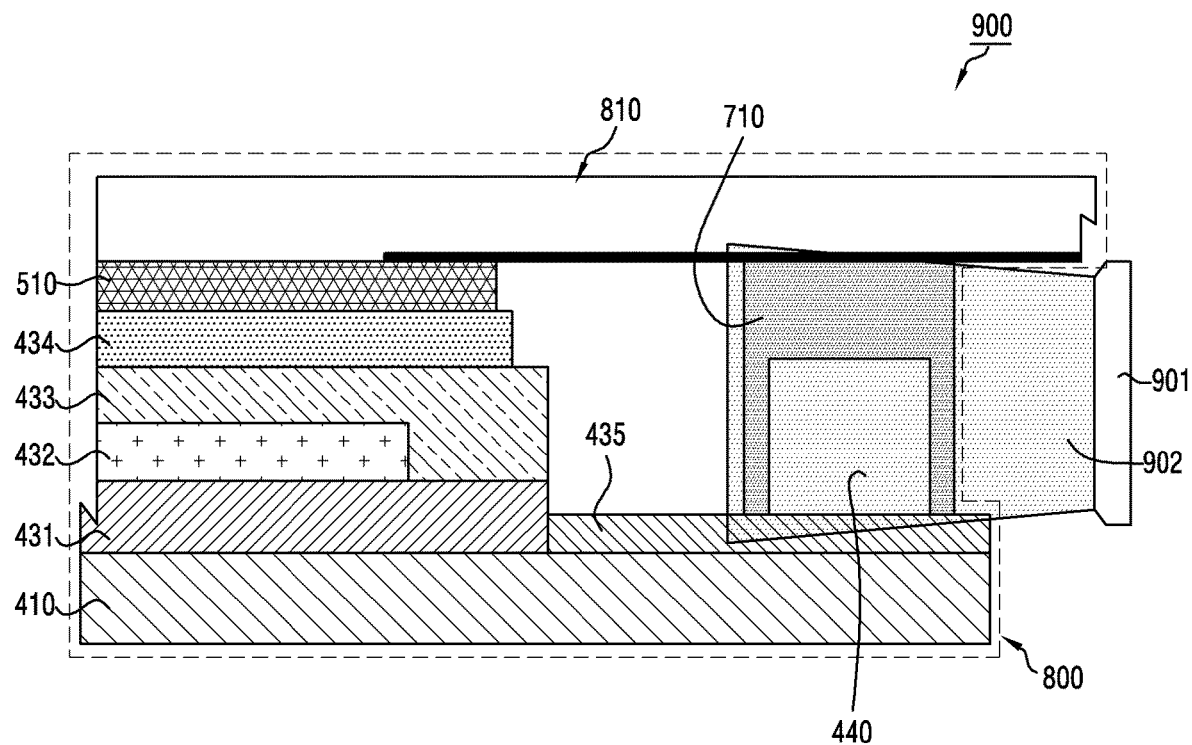
FIG. 9 illustrates the display module manufacturing method of FIG. 3.

FIG. 9 illustrates the display module manufacturing method of FIG. 3.

Referring to FIG. 9, the fourth structure 800 includes the third structure 700 including the first substrate 410, the panel 430, the display driver 440, the bonding pad 435, the temporarily cured optical adhesive member 510, and the uncured filler member 710, and a window 810 adhered to the optical adhesive member 510 and a filler member 710. The light 902 having a specified band and output from the radiation apparatus 901 is radiated to the fourth structure 800, whereby a fifth structure 900 in which the filler member 710 is temporarily cured may be formed.

Referring back to FIG. 3, the optical adhesive member and the filler member are fully cured in step 313.

When the optical adhesive member and the filler member of the fifth structure (e.g., the fifth structure 900 in FIG. 9) are fully cured, a display module may be formed.

Figure 10A:
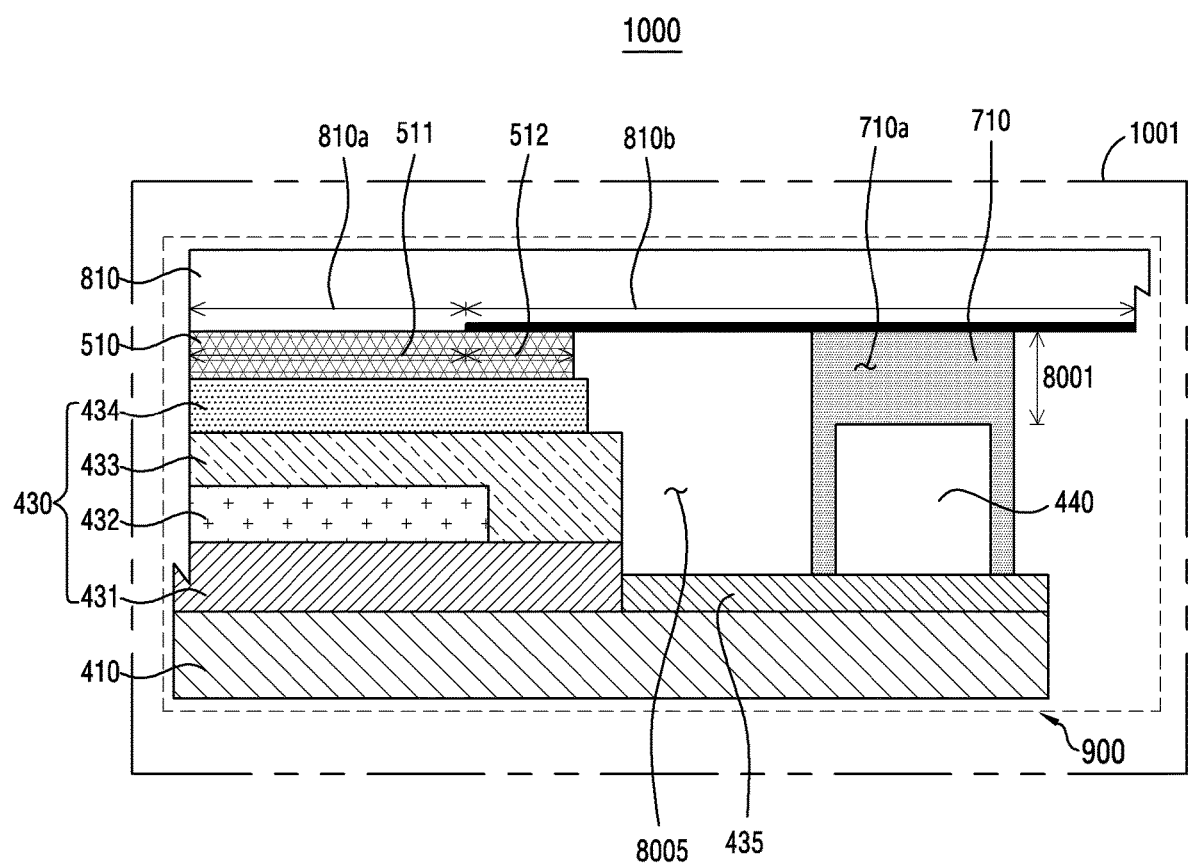
FIG. 10A illustrates a cross-sectional view of a fifth structure disposed in a radiation apparatus according to an embodiment.

FIG. 10A illustrates a cross-sectional view of a fifth structure disposed in a radiation apparatus according to an embodiment.

Referring to FIG. 10A, the third structure 900 includes a first substrate 410, a panel 430, a display driver 440, a bonding pad 435, a temporarily cured adhesive member 510, a temporarily cured filler member 710, and a window 810. A display module 1000 may be formed by fully curing the optical adhesive member 510 and the filler member 710 of the fifth structure 900 using the radiation apparatus 1001.

The light having a specified band, which is output from the radiation apparatus 1001, passes through the transparent area 810a of the window 810 and reaches the first portion 511 of the optical adhesive member 510, whereby the first portion 511 of the optical adhesive member 510 can be fully cured. The transparent area 810a of the window 810 may have a light transmittance to provide a sufficient amount of light to fully cure the first portion 511 of the optical adhesive member 510.

The light having a specified band, which is output from the radiation apparatus 1001, may completely cure the filler member 710, and reach the optical adhesive member 510 through the filler member 710.

The light having the specified band, which is output from the radiation apparatus 1001, may reach the second portion of the optical adhesive member 510 (e.g., a portion 512 aligned with the opaque region 810b of the window 810) through the portion 710a of the filler member 710 disposed in the first space 8001 between the window 810 and the display driver 440 and the separation space 8005.

Figure 10B:
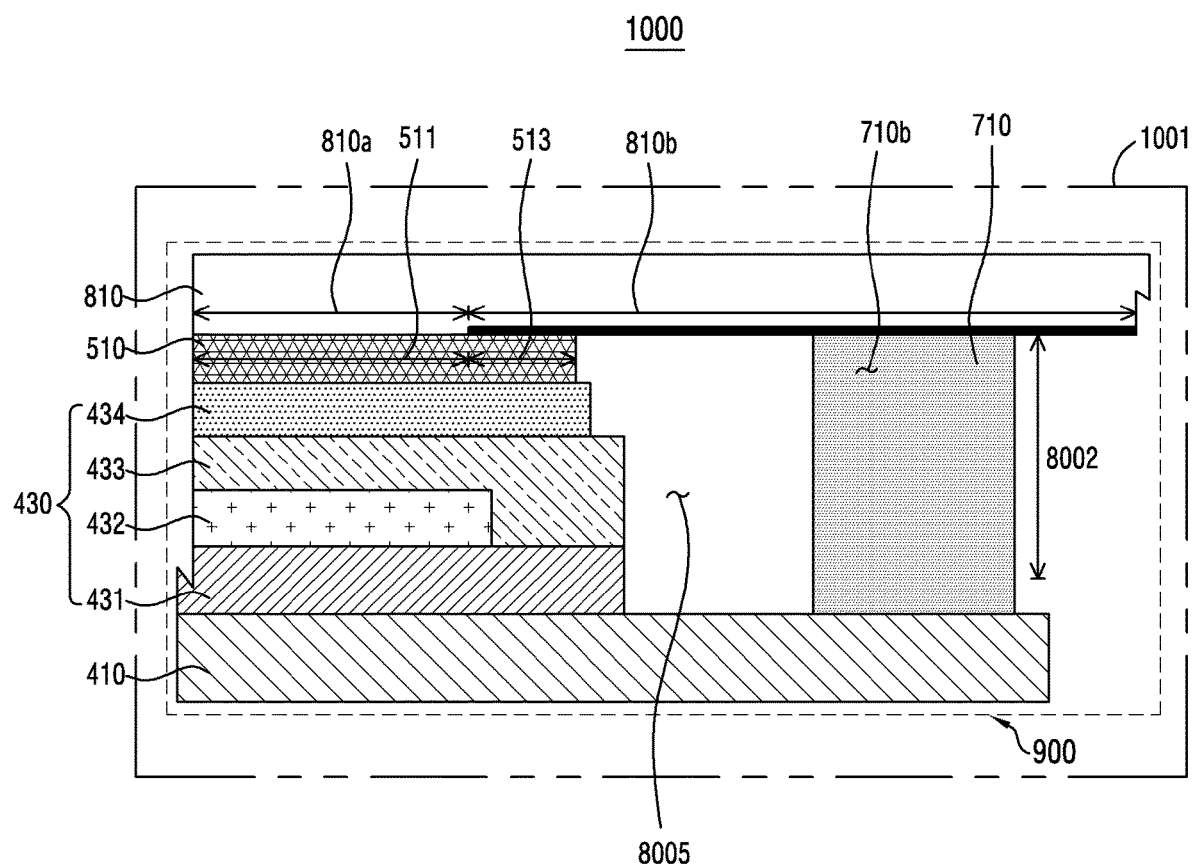
FIG. 10B illustrates a cross-sectional view of another portion of the fifth structure according to an embodiment.

FIG. 10B is a cross-sectional view of another portion of the fifth structure according to an embodiment.

Referring to FIG. 10B, light having a specified band, which is output from the radiation apparatus 1001, passes through the transparent area 810a of the window 810 and reaches the first portion 511 of the optical adhesive member 510, whereby the first portion 511 of the optical adhesive member 510 can be fully cured. The light having the specified band, output from the radiation apparatus 1001, may reach the third portion of the optical adhesive member 510 (e.g., another portion 513 aligned with the opaque region 810b of the window 810) through the portion 710a of the filler member 710 disposed in the second space 8002 between the window 810 and the first substrate 410 and the separation space 8005.

Referring to FIGS. 10A and 10B, the height of the first space 8001 (e.g., the distance between the window 810 and the display driver 440) is smaller than the height of the second space 8002 (e.g., the distance between the window 810 and the first substrate 410), whereby the amount of light passing through the portion 710a of the filler member 710 disposed in the first space 8001 may be smaller than the reference amount and the amount of light passing through the portion 710b of the filler member 710 disposed in the second space 8002 may be equal to or greater than the reference amount. When the amount of light passing through the portion 710b of the filler member 710 disposed in the second space 8002 is greater than the reference amount, the third portion 513 of the optical adhesive member 510 utilizing the portion 710b of the filler member 710 can be fully cured. When the amount of light passing through the portion 710a of the filler member 710 disposed in the first space 8001 is smaller than the reference amount, the second portion 512 of the optical adhesive member 510 utilizing the portion 710a of the filler member 710 may be hardly cured. In order to secure the amount of light required for fully curing the second portion 512 of the optical adhesive member 510, the portion 710a of the filler member 710 disposed in the first space 8001 may be designed to have a higher light transmittance than the portion 710b of the filler member 710 disposed in the second space 8002.

Alternatively, in order to secure the amount of light required for fully curing the second portion 512 of the optical adhesive member 510, the portion 710a of the filler member 710 disposed in the first space 8001 may contain a material that emits light when optically stimulated. The material may absorb optical energy, and may output a part thereof as optical energy. When the light from the radiation apparatus is applied to the filler member 710, the portion 710a of the filler member 710 containing the light-emitting material may output light, and the output light may be applied to the second portion 512 of the optical adhesive member 510. The portion 710a of the filler member 710 may contain a phosphorescent material that emits light even when light is not radiated thereon, or a fluorescent material that does not emit light when light is not radiated thereon.

In order to secure a sufficient amount of light for fully curing the second portion 512 of the optical adhesive member 510, e.g., step 307 of FIG. 3 may be performed such that multiple filler members are spaced apart from each other with a clearance therebetween, whereby the third structure 700 illustrated in FIG. 7A, FIG. 7B, or FIG. 7C can be modified.

Figure 11:
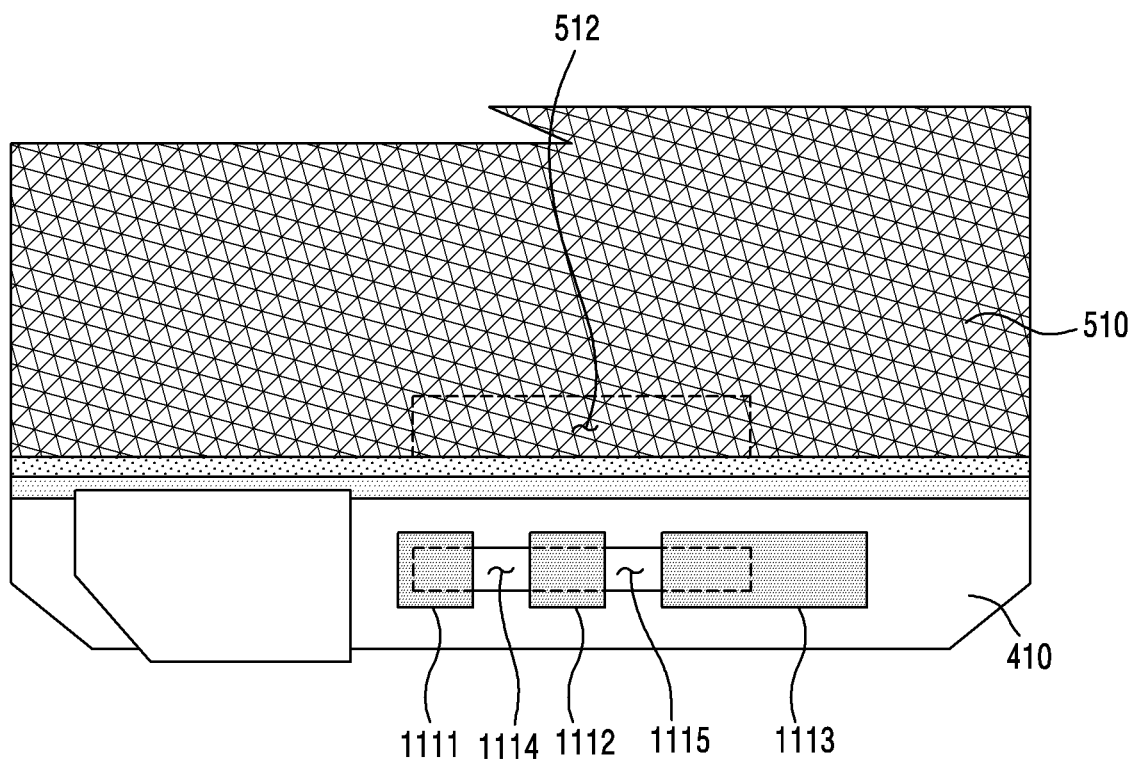
FIG. 11 illustrates a plan view of a structure in which a filler member is bonded to a display according to an embodiment.

FIG. 11 illustrates a plan view of a structure in which a filler member is bonded to a display according to an embodiment.

Referring to FIG. 11, multiple filler members 1111, 1112, and 1113 are disposed on the first substrate 410 with clearances 1114 and 1115 therebetween. The light from the radiation apparatus may reach the optical adhesive member 510 (e.g., the second portion 512) through clearances 1114 and 1115 between the multiple filler members 1111, 1112, and 1113. Although two clearances 1114 and 1115 are illustrated in FIG. 11, the disclosure is not limited thereto. For example, one clearance or three or more clearances may be formed.

A light-transmissive material may be disposed in the clearances 1114 and 1115 between the multiple filler members 1111, 1112, and 1113. The clearances 1114 and 1115 between the multiple filler members 1111, 1112, and 1113 may be fixed or variable.

The display module 1000 may include a touch sensor. The touch sensor may be included or coupled to the substrate 410, the panel 430, or the window 810. The touch sensor may be included inside the panel 430, between the encapsulation 433 and the optical layer 434 of the panel 430.

Figure 12:
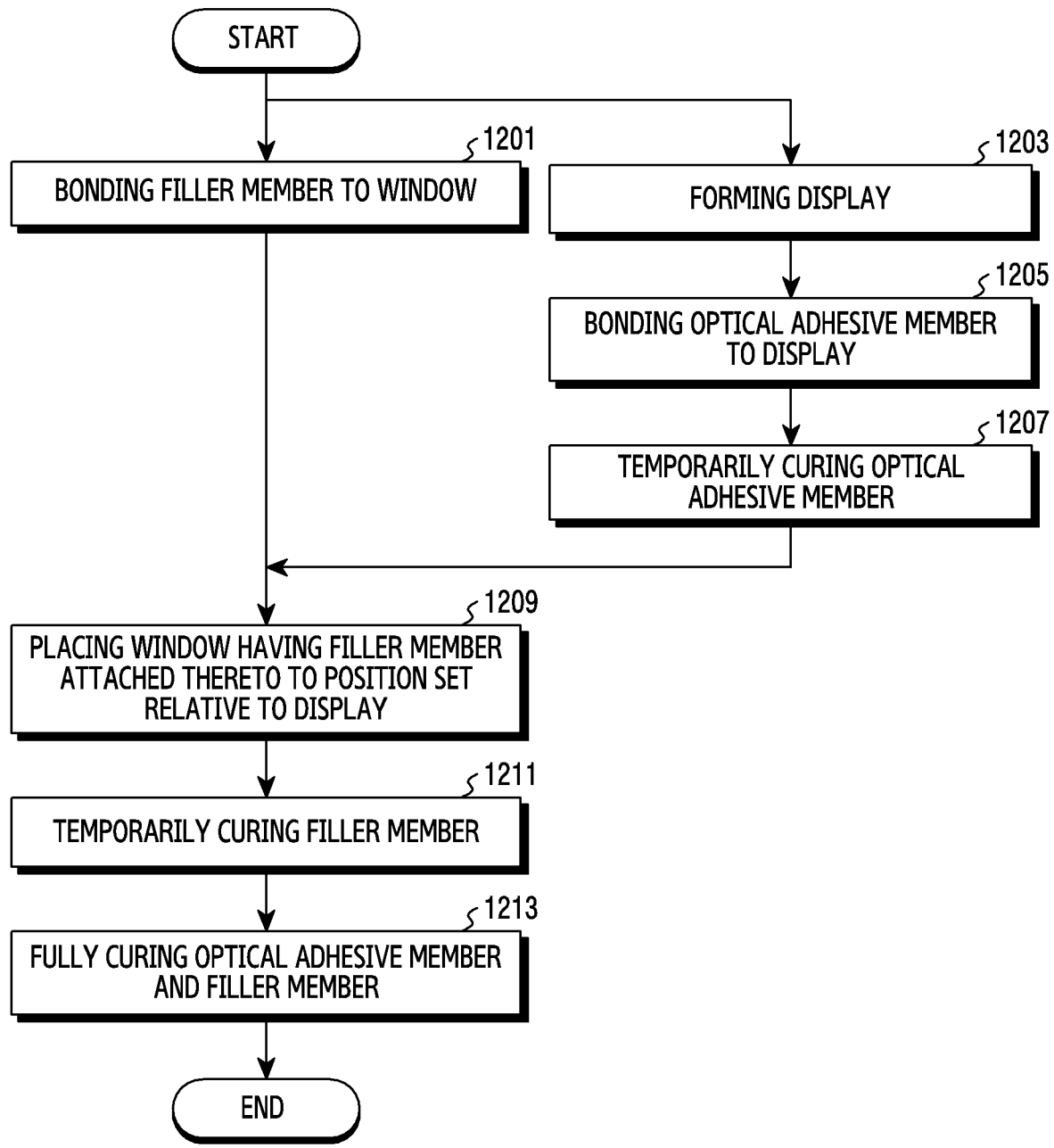
FIG. 12 illustrates a flowchart of a display module manufacturing method according to an embodiment.

FIG. 12 is a flowchart illustrating a display module manufacturing method according to an embodiment.

Referring to FIG. 12, a filler member is temporarily cured in step 1201.

Figure 13:
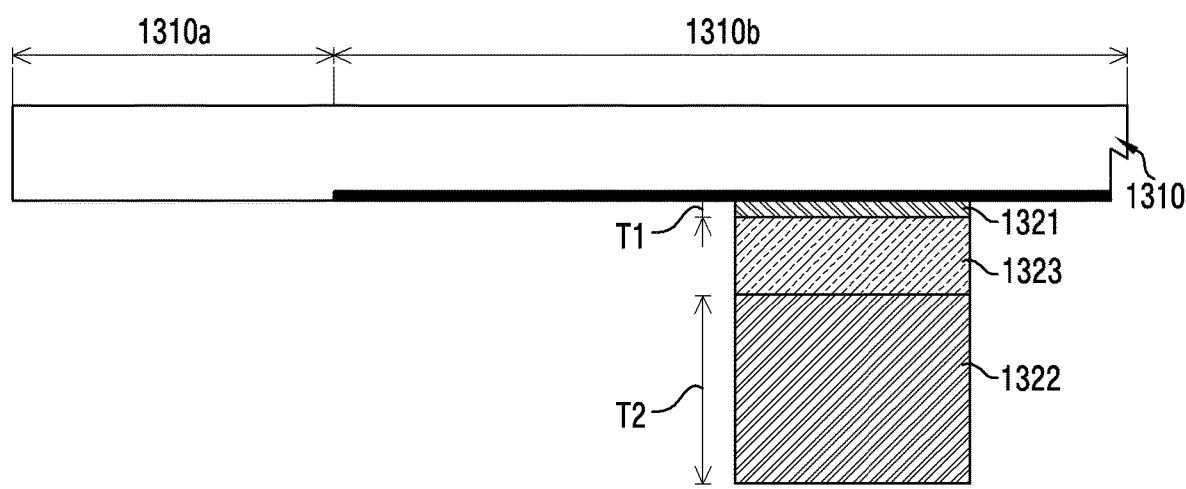
FIGS. 13, 14, 15, and 16 illustrate the display module manufacturing method of FIG. 12.

FIG. 13 illustrates the display module manufacturing method of FIG. 12.

Referring to FIG. 13, a sixth structure 1300 is formed in which a window 1310 and filler members 1321, 1322, and 1323 are coupled to each other. The window 1310 includes a transparent area 1310a and an opaque area 1310b. The filler members 1321, 1322, and 1323 may include a first adhesive layer 1321 disposed on the rear face of the opaque area 1310b of the window 1310, a second adhesive member 1322 disposed below the first adhesive layer 1321, and a light-transmissive layer 1323 disposed between the first adhesive layer 1321 and the second adhesive layer 1322. The first adhesive layer 1321 and the second adhesive layer 1322 may contain a material that is cured by reacting to light of a specified band (e.g., ultraviolet light). The first adhesive layer 1321 or the second adhesive layer 1322 may be formed of a material that requires post-curing such as full curing after pre-curing such as temporary curing. The first adhesive layer 1321 or the second adhesive layer 1322 may be formed of a material that requires post-curing without pre-curing such as temporary curing. The first adhesive layer 1321 and the second adhesive layer 1322 may contain the same material or different materials.

The first adhesive layer 1321 and the second adhesive layer 1322 in the uncured state in the sixth structure 1300 can be bonded to the light-transmissive layer 1323 with adhesive force.

At least some of the filler members 1321, 1322, and 1323 may have a light transmittance higher than a specified range (e.g., a light transmittance of about 80 or higher).

The light-transmissive layer 1323 may include a material having a light transmittance higher than those of the first adhesive layer 1321 and the second adhesive layer 1322. The light-transmissive layer 1323 in the sixth structure 1300 may be formed of a flexible film that is not in a flowing state compared to the first adhesive layer 1321 and the second adhesive layer 1322. For example, the light-transmissive layer 1323 may be a film formed of polycarbonate (PC), polyethylene terephthalate (PET), etc.

The thickness T2 of the second adhesive layer 1322 may be greater than the thickness T1 of the first adhesive layer 1321. The thickness T1 of the first adhesive layer 1321 may be about 25 μm or less.

The light-transmissive layer 1323 may have a thickness of about 150 μm to 250 μm.

Referring back to FIG. 12, a display is formed in step 1203. For example, at least a portion the display formed in step 1203 may be similar to or the same as the display 400 of FIG. 4A, FIG. 4B, or FIG. 4C, which is formed through operation 301 of FIG. 3, and therefore, a more detailed description thereof will be omitted.

In step 1205, the optical adhesive member is bonded to the display. For example, at least a portion of the structure formed in step 1205 may be similar to or the same as the first structure 500 of FIGS. 5A and 5B to which the optical adhesive member and the display are bonded through operation 303 of FIG. 3, and therefore, a more description thereof will be omitted.

In step 1207, the optical adhesive member is temporarily cured. For example, at least a portion of the structure formed in step 1207 may be similar to or the same as the second structure 600 of FIG. 6, which is obtained by temporarily curing the optical adhesive member of the first structure 500 through operation 305 of FIG. 3, and therefore, a more detailed description thereof will be omitted.

In step 1209, the window to which the filler member is bonded is disposed at a position set relative to the display.

Figure 14:
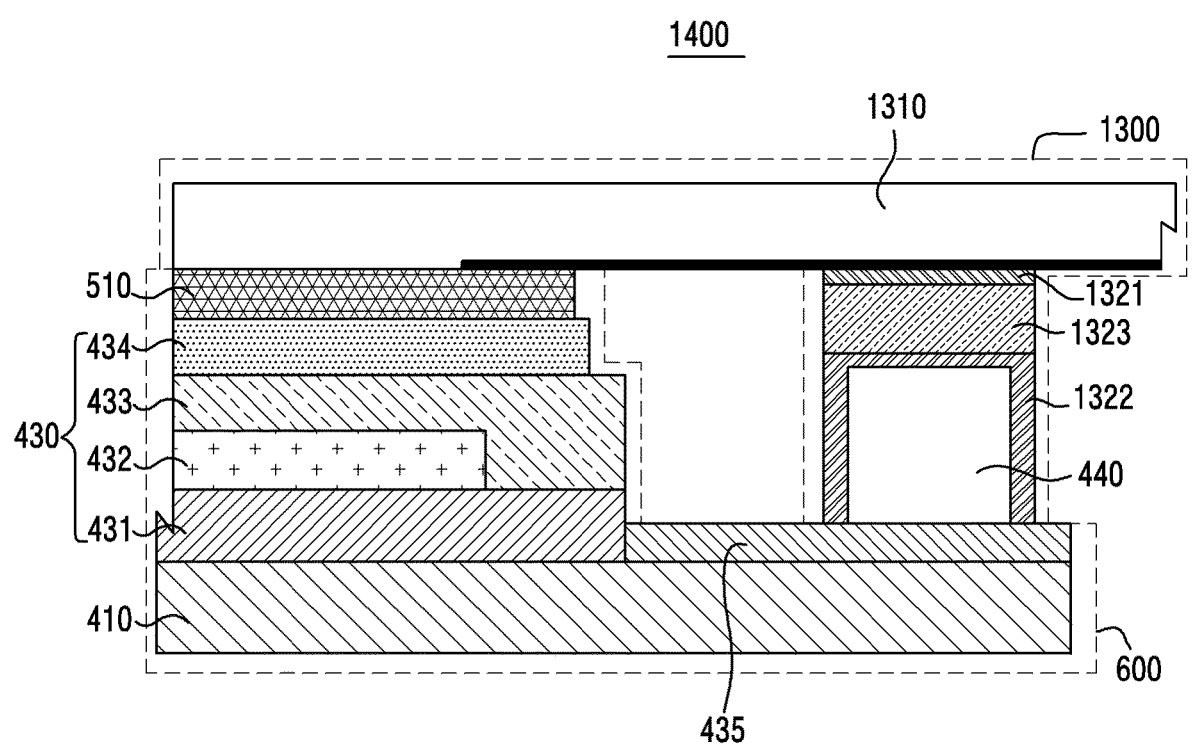

FIG. 14 illustrates a cross-sectional view of a seventh structure according to an embodiment.

Referring to FIG. 14, the second structure 600 includes the first substrate 410, the panel 430, the bonding pad 435, the display driver 440, and the temporarily cured optical adhesive member 510. The sixth structure 1300 includes the window 1310 and the filler members 1321, 1322, and 1323. When the second structure 600 is positioned at a position set relative to the sixth structure 1300, the temporarily cured optical adhesive member 510 of the second structure 600 may be bonded to the window 1310 of the sixth structure 1300 with adhesive force. When the seventh structure 1400 is formed, the uncured second adhesive layer 1322 of the sixth structure 1300 may be plastically deformed so as to cover the display driver 440 of the second structure 600. When the second adhesive layer 1322 is plastically deformed, the second adhesive layer 1322 has fluidity so as to compactly filling the empty space between the light-transmissive layer 1323. For example, the second adhesive layer 1322 may have a modulus of, e.g., $10^5$ Pa or less. The thickness T2 of the second adhesive layer 1322 in the sixth structure 1300 of FIG. 13 is set to be equal to or greater than the thickness of the display driver 440 (e.g., the height 4014 in FIG. 4B), so that the display driver 440 does not directly press the light-transmissive layer 1323 when the seventh structure 1400 is formed.

Referring back to FIG. 12, a filler member is temporarily cured in operation 1211.

Figure 15:
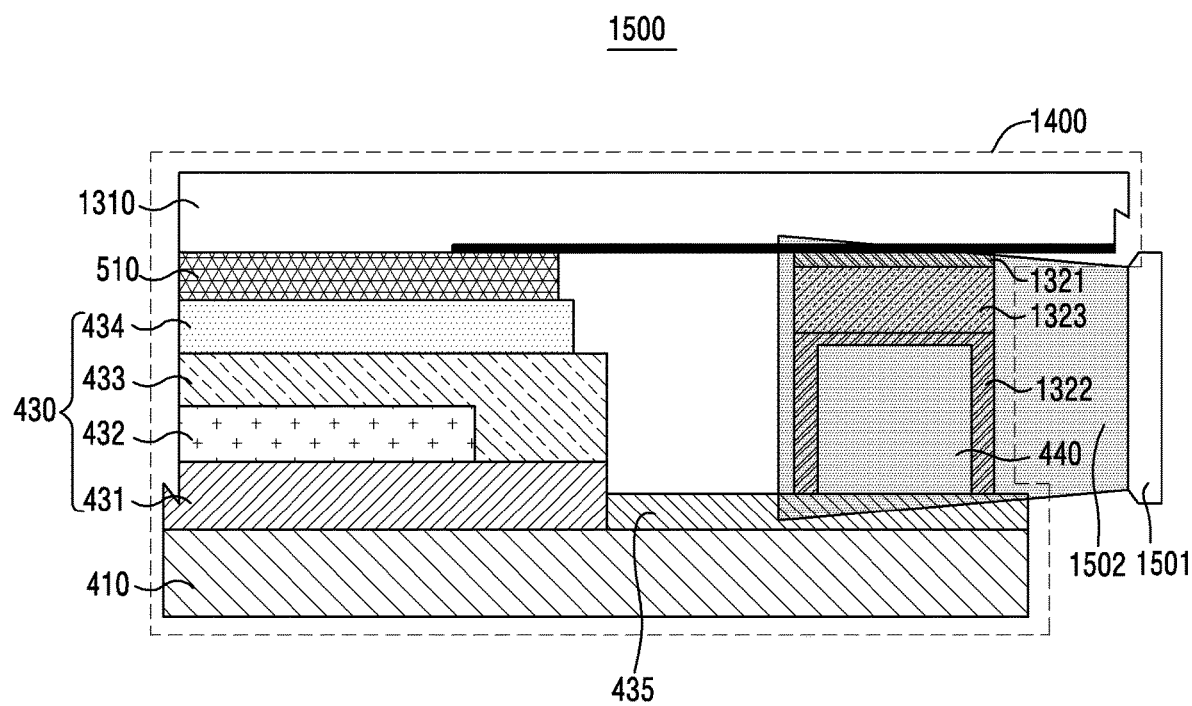

FIG. 15 illustrates the display module manufacturing method of FIG. 12.

Referring to FIG. 15, the seventh structure 1400 includes the first substrate 410, the panel 430, the display driver 440, the bonding pad 435, the temporarily cured optical adhesive member 510, the uncured filler member 710, the window 1310, and the filler members 1321, 1322, and 1323. The light 1502 having a specified band, output from the radiation apparatus 1501, is radiated to the seventh structure 1400, whereby an eighth structure 1500 in which at least some of the filler members 1321, 1322, and 1323 (e.g., the first adhesive layer 1321 and the second adhesive layer 1322) are temporarily cured may be formed. When the first adhesive layer 1321 and the second adhesive layer 1322 of the filler members 1321, 1322, and 1323 are formed of a material that requires post-curing without pre-curing, such as temporary curing, step 1211 may be omitted.

Referring back to FIG. 12, the optical adhesive member and the filler member are fully cured in step 1213. For example, when the optical adhesive member and the filler member of the eighth structure (e.g., the eighth structure 1500 in FIG. 15) are fully cured, a display module may be formed.

Figure 16:
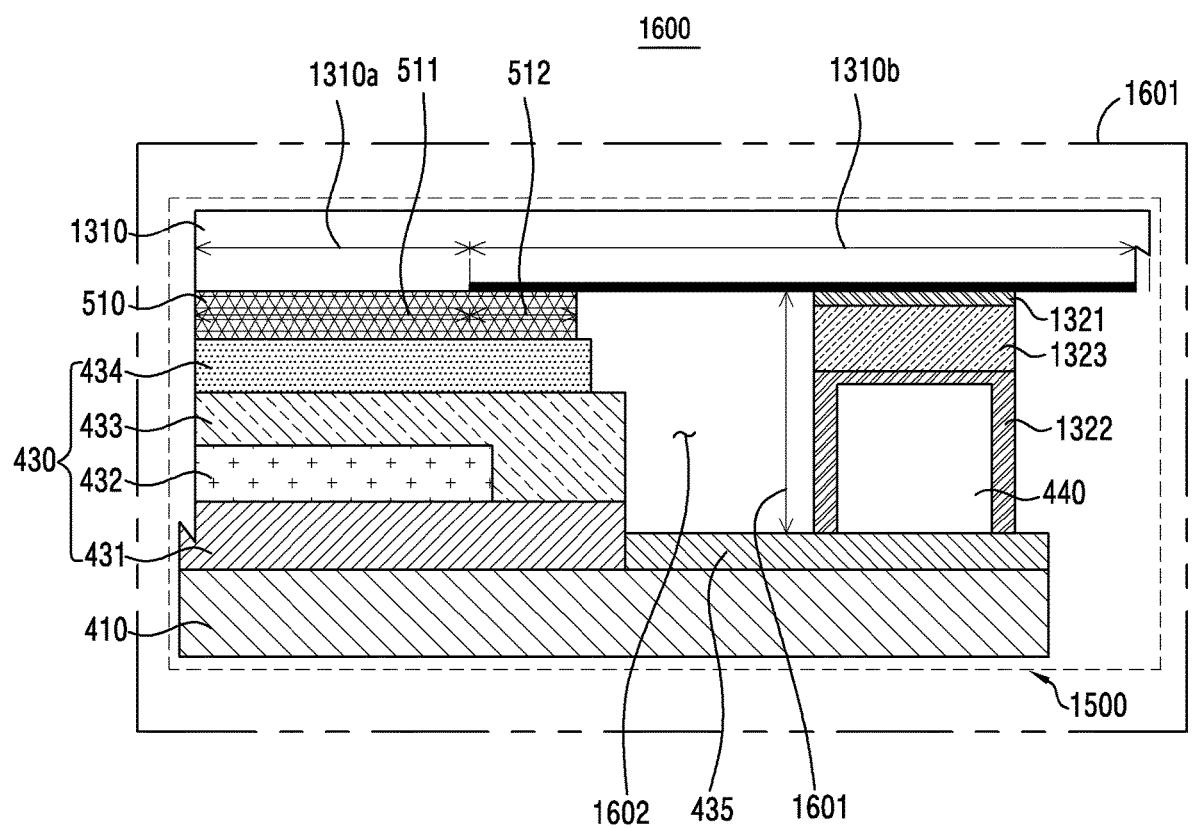

FIG. 16 illustrates a cross-sectional view of an eighth structure disposed in a radiation apparatus according to an embodiment.

Referring to FIG. 16, the eighth structure 1500 includes the first substrate 410, the panel 430, the display driver 440, the bonding pad 435, a temporarily cured adhesive member 510, filler members 1321, 1322, and 1323 at least some of which are temporarily cured, and the window 1310. A display module 1600 may be formed by fully curing the optical adhesive member 510 and the filler members 1321, 1322, and 1323 of the eighth structure 1500 using the radiation apparatus 1601.

The light having a specified band, output from the radiation apparatus 1601, passes through the transparent area 1310a of the window 1310 and reaches the first portion 511 of the optical adhesive member 510, whereby the first portion 511 of the optical adhesive member 510 can be fully cured.

The light having a specified band, which is output from the radiation apparatus 1601, may fully cure the first adhesive layer 1321 and the second adhesive layer 1322 of the filler member 1321, 1322, and 1323 disposed in the first space 1601 between the window 1310 and the display driver 440. The light having a specified band, output from the radiating apparatus 1601, may reach the second portion 512 of the optical adhesive member 510 through the filler members 1321, 1322, and 1323 disposed in the first space 1601 and the separation space 1602. The light passing through at least some of the filler members 1321, 1322, and 1323 disposed in the first space 1601 may provide a sufficient amount of light for fully curing the second portion 512 of the optical adhesive member 510.

At least some of the filler members 1321, 1322, and 1323 may include a material that emits light when optically stimulated.

Figure 17:
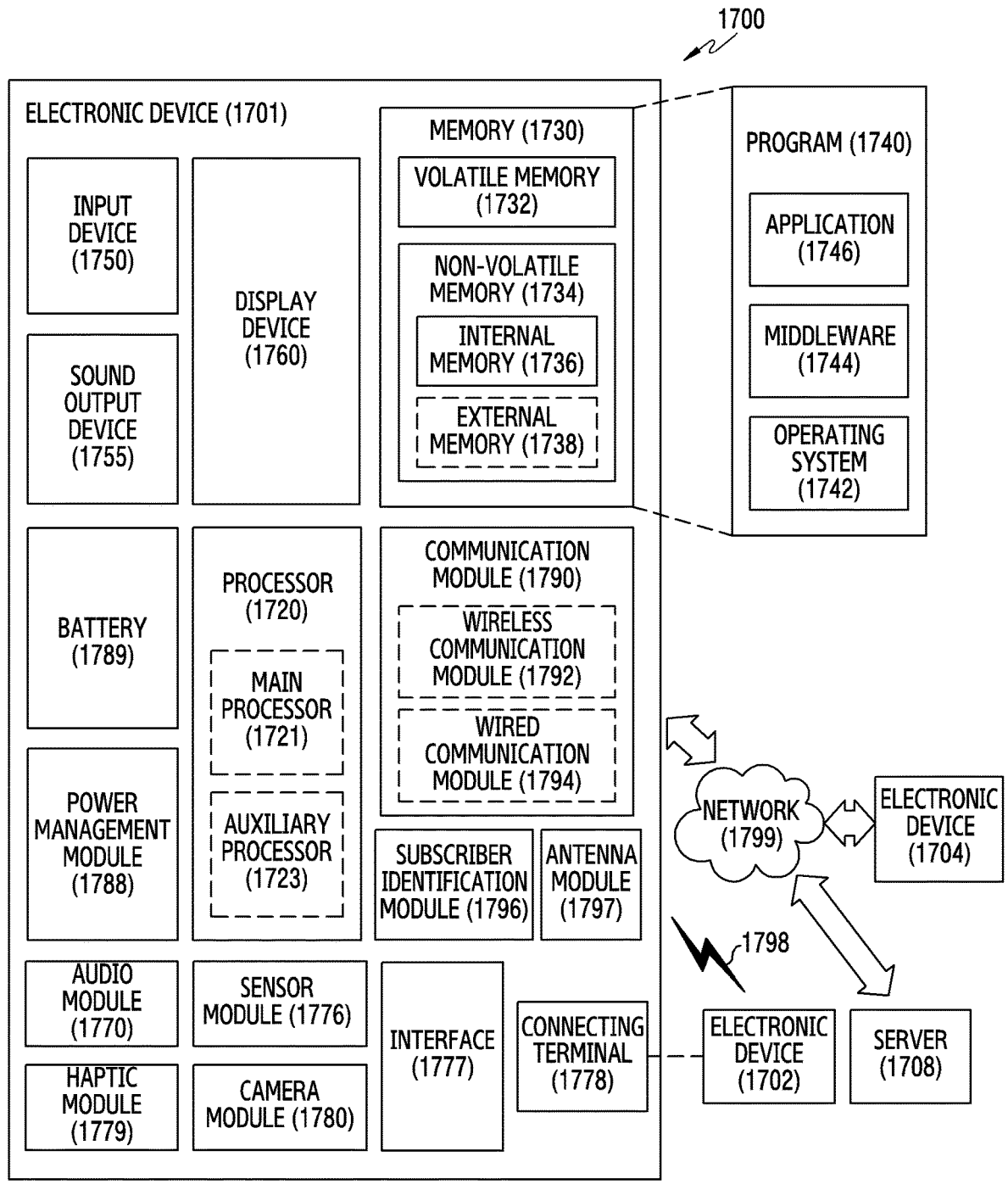
FIG. 17 illustrates an electronic device according to an embodiment.

FIG. 17 illustrates an electronic device 1701 in a network environment 1700 according to an embodiment. Referring to FIG. 17, the electronic device 1701 in the network environment 1700 may communicate with an electronic device 1702 via a first network 1798 (e.g., a short-range wireless communication network), or an electronic device 1704 or a server 1708 via a second network 1799 (e.g., a long-range wireless communication network). The electronic device 1701 may communicate with the electronic device 1704 via the server 1708. The electronic device 1701 may include a processor 1720, memory 1730, an input device 1750, a sound output device 1755, a display device 1760, an audio module 1770, a sensor module 1776, an interface 1777, a haptic module 1779, a camera module 1780, a power management module 1788, a battery 1789, a communication module 1790, a subscriber identification module (SIM) 1796, or an antenna module 1797. At least one (e.g., the display device 1760 or the camera module 1780) of the components may be omitted from the electronic device 1701, or one or more other components may be added in the electronic device 1701. Some of the components may be implemented as single integrated circuitry. For example, the sensor module 1776 (e.g., a fingerprint sensor, an iris sensor, or an illuminance sensor) may be implemented as embedded in the display device 1760 (e.g., a display).

The processor 1720 may execute, for example, software (e.g., a program 1740) to control at least one other component (e.g., a hardware or software component) of the electronic device 1701 coupled with the processor 1720, and may perform various data processing or computation. As at least part of the data processing or computation, the processor 1720 may load a command or data received from another component (e.g., the sensor module 1776 or the communication module 1790) in volatile memory 1732, process the command or the data stored in the volatile memory 1732, and store resulting data in non-volatile memory 1734. The processor 1720 may include a main processor 1721 (e.g., a central processing unit (CPU) or an application processor (AP)), and an auxiliary processor 1723 (e.g., a graphics processing unit (GPU), an image signal processor (ISP), a sensor hub processor, or a communication processor (CP)) that is operable independently from, or in conjunction with, the main processor 1721.

Additionally or alternatively, the auxiliary processor 1723 may be adapted to consume less power than the main processor 1721, or to be specific to a specified function. The auxiliary processor 1723 may be implemented as separate from, or as part of the main processor 1721.

The auxiliary processor 1723 may control at least some of functions or states related to at least one component (e.g., the display device 1760, the sensor module 1776, or the communication module 1790) among the components of the electronic device 1701, instead of the main processor 1721 while the main processor 1721 is in an inactive (e.g., sleep) state, or together with the main processor 1721 while the main processor 1721 is in an active state (e.g., executing an application). The auxiliary processor 1723 (e.g., an image signal processor or a communication processor) may be implemented as part of another component (e.g., the camera module 1780 or the communication module 1790) functionally related to the auxiliary processor 1723.

The memory 1730 may store various data used by at least one component (e.g., the processor 1720 or the sensor module 1776) of the electronic device 1701. The various data may include, for example, software (e.g., the program 1740) and input data or output data for a command related thereto. The memory 1730 may include the volatile memory 1732 or the non-volatile memory 1734.

The program 1740 may be stored in the memory 1730 as software, and may include, for example, an operating system (OS) 1742, middleware 1744, or an application 1746.

The input device 1750 may receive a command or data to be used by other component (e.g., the processor 1720) of the electronic device 1701, from the outside (e.g., a user) of the electronic device 1701. The input device 1750 may include, for example, a microphone, a mouse, a keyboard, or a digital pen (e.g., a stylus pen).

The sound output device 1755 may output sound signals to the outside of the electronic device 1701. The sound output device 1755 may include, for example, a speaker or a receiver. The speaker may be used for general purposes, such as playing multimedia or playing record, and the receiver may be used for an incoming calls. The receiver may be implemented as separate from, or as part of the speaker.

The display device 1760 may visually provide information to the outside (e.g., a user) of the electronic device 1701. The display device 1760 may include, for example, a display, a hologram device, or a projector and control circuitry to control a corresponding one of the display, hologram device, and projector. The display device 1760 may include touch circuitry adapted to detect a touch, or sensor circuitry (e.g., a pressure sensor) adapted to measure the intensity of force incurred by the touch.

The audio module 1770 may convert a sound into an electrical signal and vice versa. The audio module 1770 may obtain the sound via the input device 1750, or output the sound via the sound output device 1755 or a headphone of an external electronic device (e.g., an electronic device 1702) directly (e.g., wiredly) or wirelessly coupled with the electronic device 1701.

The sensor module 1776 may detect an operational state (e.g., power or temperature) of the electronic device 1701 or an environmental state (e.g., a state of a user) external to the electronic device 1701, and then generate an electrical signal or data value corresponding to the detected state. The sensor module 1776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1777 may support one or more specified protocols to be used for the electronic device 1701 to be coupled with the external electronic device (e.g., the electronic device 1702) directly (e.g., wiredly) or wirelessly. The interface 1777 may include, for example, a high definition multimedia interface (HDMI), a universal serial bus (USB) interface, a secure digital (SD) card interface, or an audio interface.

A connecting terminal 1778 may include a connector via which the electronic device 1701 may be physically connected with the external electronic device (e.g., the electronic device 1702 The connecting terminal 1778 may include, for example, a HDMI connector, a USB connector, a SD card connector, or an audio connector (e.g., a headphone connector).

The haptic module 1779 may convert an electrical signal into a mechanical stimulus (e.g., a vibration or a movement) or electrical stimulus which may be recognized by a user via his tactile sensation or kinesthetic sensation. The haptic module 1779 may include, for example, a motor, a piezoelectric element, or an electric stimulator.

The camera module 1780 may capture a still image or moving images. The camera module 1780 may include one or more lenses, image sensors, image signal processors, or flashes.

The power management module 1788 may manage power supplied to the electronic device 1701. The power management module 1788 may be implemented as at least part of, for example, a power management integrated circuit (PMIC).

The battery 1789 may supply power to at least one component of the electronic device 1701. The battery 1789 may include, for example, a primary cell which is not rechargeable, a secondary cell which is rechargeable, or a fuel cell.

The communication module 1790 may support establishing a direct (e.g., wired) communication channel or a wireless communication channel between the electronic device 1701 and the external electronic device (e.g., the electronic device 1702, the electronic device 1704, or the server 1708) and performing communication via the established communication channel. The communication module 1790 may include one or more communication processors that are operable independently from the processor 1720 (e.g., the application processor (AP)) and supports a direct (e.g., wired) communication or a wireless communication. The communication module 1790 may include a wireless communication module 1792 (e.g., a cellular communication module, a short-range wireless communication module, or a global navigation satellite system (GNSS) communication module) or a wired communication module 1794 (e.g., a local area network (LAN) communication module or a power line communication (PLC) module). A corresponding one of these communication modules may communicate with the external electronic device via the first network 1798 (e.g., a short-range communication network, such as Bluetooth™, wireless-fidelity (Wi-Fi) direct, or infrared data association (IrDA)) or the second network 1799 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1792 may identify and authenticate the electronic device 1701 in a communication network, such as the first network 1798 or the second network 1799, using subscriber information (e.g., international mobile subscriber identity (IMSI)) stored in the subscriber identification module 1796.

The antenna module 1797 may transmit or receive a signal or power to or from the outside (e.g., the external electronic device) of the electronic device 1701. The antenna module 1797 may include an antenna including a radiating element composed of a conductive material or a conductive pattern formed in or on a substrate (e.g., PCB). The antenna module 1797 may include a plurality of antennas. In such a case, at least one antenna appropriate for a communication scheme used in the communication network, such as the first network 1798 or the second network 1799, may be selected, for example, by the communication module 1790 (e.g., the wireless communication module 1792) from the plurality of antennas. The signal or the power may then be transmitted or received between the communication module 1790 and the external electronic device via the selected at least one antenna. Another component (e.g., a radio frequency integrated circuit (RFIC)) other than the radiating element may be additionally formed as part of the antenna module 1797.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 1701 and the external electronic device 1704 via the server 1708 coupled with the second network 1799. Each of the electronic devices 1702 and 1704 may be a device of a same type as, or a different type, from the electronic device 1701. All or some of operations to be executed at the electronic device 1701 may be executed at one or more of the external electronic devices 1702, 1704, or 1708. For example, if the electronic device 1701 should perform a function or a service automatically, or in response to a request from a user or another device, the electronic device 1701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1701. The electronic device 1701 may provide the outcome, with or without further processing of the outcome, as at least part of a reply to the request. To that end, a cloud computing, distributed computing, or client-server computing technology may be used, for example.

Figure 18:
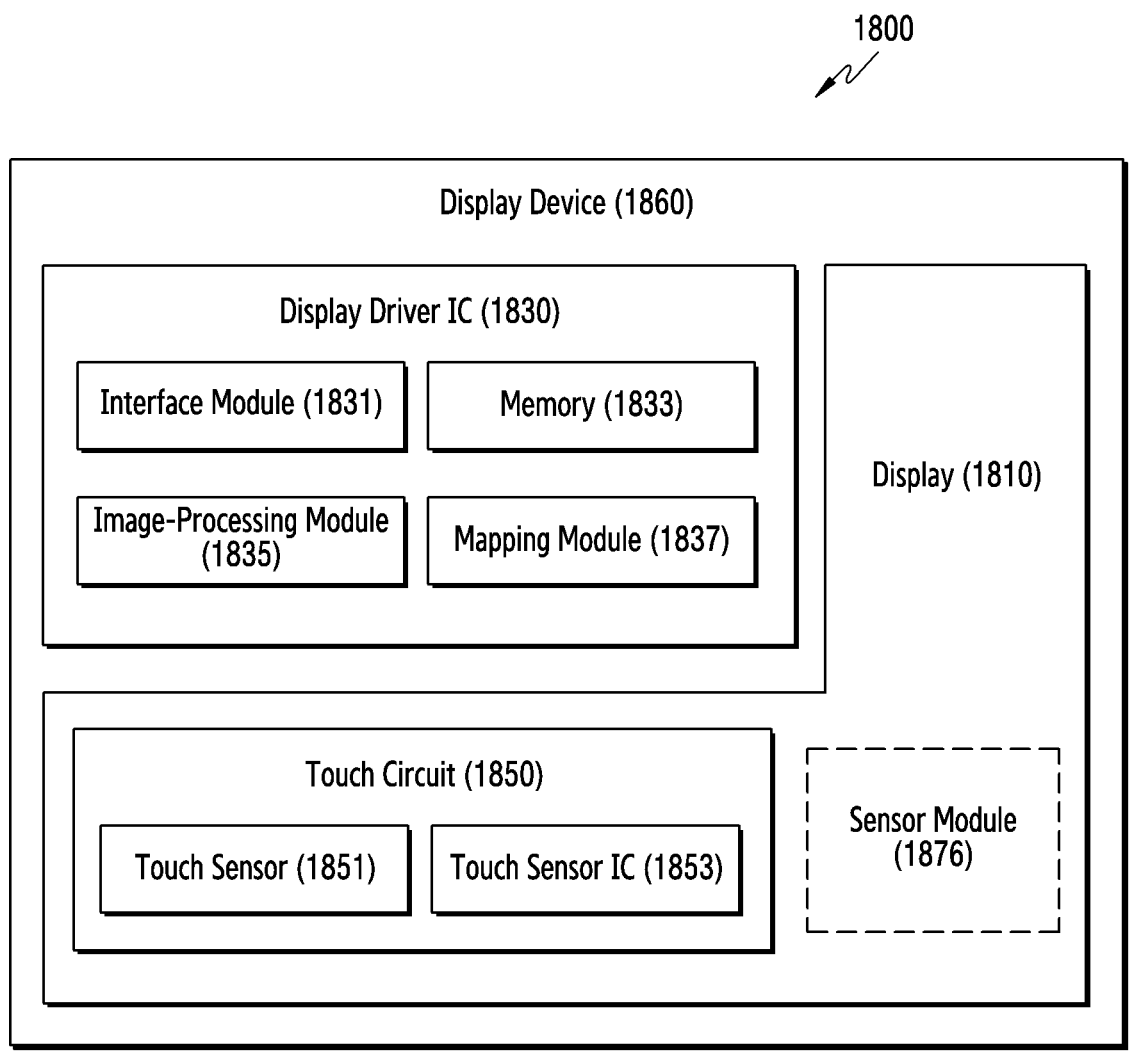
FIG. 18 illustrates a display device according to an embodiment.

FIG. 18 illustrates a display device 1760 according to an embodiment. Referring to FIG. 18, the display device 1760 may include a display 1810 and a display driver integrated circuit (DDI) 1830 to control the display 1810. The DDI 1830 may include an interface module 1831, memory 1833 (e.g., buffer memory), an image processing module 1835, or a mapping module 1837. The DDI 1830 may receive image information that contains image data or an image control signal corresponding to a command to control the image data from another component of the electronic device 1701 via the interface module 1831. For example, the image information may be received from the processor 1720 (e.g., the main processor 1721 (e.g., an application processor)) or the auxiliary processor 1723 (e.g., a graphics processing unit) operated independently from the function of the main processor 1721. The DDI 1830 may communicate, for example, with touch circuitry 1750 or the sensor module 1776 via the interface module 1831. The DDI 1830 may also store at least part of the received image information in the memory 1833, for example, on a frame by frame basis.

The image processing module 1835 may perform pre-processing or post-processing (e.g., adjustment of resolution, brightness, or size) with respect to at least part of the image data. The pre-processing or post-processing may be performed, for example, based at least in part on one or more characteristics of the image data or one or more characteristics of the display 1810.

The mapping module 1837 may generate a voltage value or a current value corresponding to the image data pre-processed or post-processed by the image processing module 1835 The generating of the voltage value or current value may be performed, for example, based at least in part on one or more attributes of the pixels (e.g., an array, such as an RGB stripe or a pentile structure, of the pixels, or the size of each subpixel). At least some pixels of the display 1810 may be driven, for example, based at least in part on the voltage value or the current value such that visual information (e.g., a text, an image, or an icon) corresponding to the image data may be displayed via the display 1810.

The display device 1760 may further include the touch circuitry 1850. The touch circuitry 1850 may include a touch sensor 1851 and a touch sensor IC 1853 to control the touch sensor 1851. The touch sensor IC 1853 may control the touch sensor 1851 to sense a touch input or a hovering input with respect to a certain position on the display 1810. To achieve this, for example, the touch sensor 1851 may detect (e.g., measure) a change in a signal (e.g., a voltage, a quantity of light, a resistance, or a quantity of one or more electric charges) corresponding to the certain position on the display 1810. The touch circuitry 1850 may provide input information (e.g., a position, an area, a pressure, or a time) indicative of the touch input or the hovering input detected via the touch sensor 1851 to the processor 1720. At least part (e.g., the touch sensor IC 1853) of the touch circuitry 1850 may be formed as part of the display 1810 or the DDI 1830, or as part of another component (e.g., the auxiliary processor 1723) disposed outside the display device 1760.

The display device 1760 may further include at least one sensor (e.g., a fingerprint sensor, an iris sensor, a pressure sensor, or an illuminance sensor) of the sensor module 1776 or a control circuit for the at least one sensor. In such a case, the at least one sensor or the control circuit for the at least one sensor may be embedded in one portion of a component (e.g., the display 1810, the DDI 1830, or the touch circuitry 1750)) of the display device 1760. For example, when the sensor module 1776 embedded in the display device 1760 includes a biometric sensor (e.g., a fingerprint sensor), the biometric sensor may obtain biometric information (e.g., a fingerprint image) corresponding to a touch input received via a portion of the display 1810. As another example, when the sensor module 1776 embedded in the display device 1760 includes a pressure sensor, the pressure sensor may obtain pressure information corresponding to a touch input received via a partial or whole area of the display 1810. The touch sensor 1851 or the sensor module 1776 may be disposed between pixels in a pixel layer of the display 1810, or over or under the pixel layer.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented in a form of an application-specific integrated circuit (ASIC).

Various embodiments as set forth herein may be implemented as software (e.g., the program 1740) including one or more instructions that are stored in a storage medium (e.g., internal memory 1736 or external memory 1738) that is readable by a machine (e.g., the electronic device 1701). For example, a processor (e.g., the processor 1720) of the machine (e.g., the electronic device 1701) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

According to an embodiment, an electronic device may include a window including a transparent area and an opaque area; a panel disposed below the transparent area and including multiple pixels; a substrate disposed below the panel; an optical adhesive member disposed between the window and the panel; and a filler member filled in at least a portion of a space formed between the opaque area and the substrate. The filler member may transmit a light of a light of a designated band, which is capable of curing the optical adhesive member, to a portion of the optical adhesive member disposed below the opaque area through a separation space between the filler member and the portion of the optical adhesive member.

At least a portion of the filler member may have a light transmittance in a designated range.

The filler member may include multiple layers having different light transmittances.

The multiple layers may have different thicknesses.

At least a portion of the filler member may have a modulus of $10^5$ Pa or less.

The electronic device may further include at least one transparent member disposed in the separation space.

The filler member may include multiple portions, which are separated from each other with a clearance therebetween.

The electronic device may further include a light-transmissive member disposed in the clearances.

The filler member may comprise a substance that emits light when optically stimulated.

The filler member may comprise a substance that requires post-curing without temporary curing.

The panel may include a polarizing layer disposed between the multiple pixels and the window, and the optical adhesive member may be disposed between the window and the polarizing layer.

The substrate may be based on LTPS.

The electronic device may further comprise a DDI coupled to the substrate and having at least a portion covered by the filler member.

The filler member may include at least one light-transmissive layer disposed between the window and the DDI.

The optical adhesive member may include at least one of OCA, OCR, or SVR.

According to an embodiment, an electronic device may include a window including a transparent area and an opaque area; a panel disposed below the transparent area and including multiple pixels; a substrate disposed below the panel; an optical adhesive member disposed between the window and the panel; and a filler member filling at least a portion of a space formed between the opaque area and the substrate. The filler member may be light-transmissive and disposed apart from the optical adhesive member, and the filler member may transmit an external light of a designated band, which is capable of curing the optical adhesive member, to a portion of the optical adhesive member disposed below the opaque area through a separation space between the filler member and the portion of the optical adhesive member.

The electronic device may further include a DDI coupled to substrate and having at least a portion covered by the filler member.

The filler member may include multiple layers disposed between the window and the DDI and having different light transmittances.

The filler member may include multiple portions, which are separated from each other with clearances therebetween.

The filler member may comprise a substance that is cured by the light of the specified band.

As described above in the embodiments above, when a display, which includes a panel having multiple pixels that is bonded to a substrate, is bonded to a window that forms an appearance of an electronic device, a portion of the substrate, to which a display driver, such as a DDI is bonded, is bonded to the window via a filler member. Thus, it is possible to increase the rigidity or durability of the portion of the substrate. In addition, since the filler member is formed of a light-transmissive material so as to allow light of a specified band output from the radiation apparatus to reach a portion of the optical adhesive member between the display panel and the window through the filler member, the optical adhesive member can be rigidly cured between the display panel and the window.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device, comprising:
   a window including a transparent area and an opaque area;

a panel disposed below the transparent area, the panel including an encapsulation and a light emitting layer including multiple pixels;

a substrate disposed below the panel;

an optical adhesive member disposed between the window and the panel; and a filler member disposed in at least a portion of a space formed between the opaque area and the substrate, wherein the filler member transmits a light of a designated band, for curing the optical adhesive member, to a portion of the optical adhesive member disposed below the opaque area through a separation space between the filler member and the portion of the optical adhesive member, wherein at least a portion of the filler member is disposed adjacent to a side of the separation space, and wherein the optical adhesive member and the encapsulation are disposed adjacent to an opposite side of the separation space.

2. The electronic device of claim 1, wherein the encapsulation is configured to prevent external effect on the light emitting layer.

3. The electronic device of claim 1, wherein the filler member includes multiple layers having different light transmittances.

4. The electronic device of claim 3, wherein the multiple layers have different thicknesses.

5. The electronic device of claim 1, wherein at least a portion of the filler member has a modulus of $10^5$ Pa or less.

6. The electronic device of claim 1, further comprising a transparent member disposed in the separation space.

7. The electronic device of claim 1, wherein the filler member includes multiple portions, which are separated from each other with clearances therebetween.

8. The electronic device of claim 7, further comprising a light-transmissive member disposed in at least one of the clearances.

9. The electronic device of claim 1, wherein the filler member comprises a substance that emits light when optically stimulated.

10. The electronic device of claim 1, wherein the filler member comprises a substance that requires post-curing without temporary curing.

11. The electronic device of claim 1, wherein the panel further includes a polarizing layer disposed between the multiple pixels and the window, and wherein the optical adhesive member is disposed between the window and the polarizing layer.

12. The electronic device of claim 1, wherein the substrate includes low-temperature polycrystalline silicon (LTPS).

13. The electronic device of claim 1, further comprising a display driver integrated circuit (DDI) coupled to the substrate and having at least a portion covered by the filler member.

14. The electronic device of claim 13, wherein the filler member includes at least one light-transmissive layer disposed between the window and the DDI.

15. The electronic device of claim 1, wherein the optical adhesive member includes at least one of optical clear adhesive (OCA), optical clear resin (OCR), or super view resin (SVR).

16. An electronic device, comprising:

a window including a transparent area and an opaque area;

a panel disposed below the transparent area, the panel including an encapsulation and a light emitting layer including multiple pixels;

a substrate disposed below the panel;

an optical adhesive member disposed between the window and the panel; and a filler member disposed in at least a portion of a space formed between the opaque area and the substrate, wherein the filler member is light-transmissive and disposed apart from the optical adhesive member, and the filler member is configured to transmit an external light of a designated band, for curing the optical adhesive member, to a portion of the optical adhesive member disposed below the opaque area through a separation space between the filler member and the portion of the optical adhesive member, wherein at least a portion of the filler member is disposed adjacent to a side of the separation space, and wherein the optical adhesive member and the encapsulation are disposed adjacent to an opposite side of the separation space.

17. The electronic device of claim 16, further comprising a display driver integrated circuit (DDI) coupled to the substrate and having at least a portion covered by the filler member.

18. The electronic device of claim 17, wherein the filler member includes multiple layers disposed between the window and the DDI and having different light transmittances.

19. The electronic device of claim 16, wherein the filler member includes multiple portions, which are separated from each other with clearances therebetween.

20. The electronic device of claim 16, wherein the filler member comprises a substance that is cured by the light of the designated band.

* * * * *